(12) United States Patent
Cotton et al.

(10) Patent No.: US 7,768,238 B2
(45) Date of Patent: Aug. 3, 2010

(54) SYSTEM AND METHOD FOR REMOTE MONITORING OF BATTERY CONDITION

(75) Inventors: Charles B. Cotton, Rocklin, CA (US); Douglas Sheppard, San Francisco, CA (US); Ronnie Lim, Elk Grove, CA (US); Stephen D. Cotton, San Rafael, CA (US); Michael Jump, Santa Rosa, CA (US)

(73) Assignee: Data Power Monitoring Corporation, San Rafael, CA (US)

( * ) Notice: Subject to any disclaimer, the term of this patent is extended or adjusted under 35 U.S.C. 154(b) by 0 days.

(21) Appl. No.: 12/540,701

(22) Filed: Aug. 13, 2009

(65) Prior Publication Data

US 2010/0114512 A1 May 6, 2010

Related U.S. Application Data

(62) Division of application No. 11/002,257, filed on Dec. 3, 2004, now Pat. No. 7,576,517.

(60) Provisional application No. 60/631,165, filed on Nov. 29, 2004.

(51) Int. Cl.
*H02J 7/00* (2006.01)
*G01R 31/36* (2006.01)
*G06F 15/16* (2006.01)

(52) U.S. Cl. .................. 320/136; 702/63; 709/217

(58) Field of Classification Search .......... 320/132, 320/134, 136, DIG. 21; 702/62, 63, 119, 702/120; 709/217, 219; 324/426, 427, 428, 324/429, 431, 432, 434, 435
See application file for complete search history.

(56) References Cited

U.S. PATENT DOCUMENTS

| 6,174,617 B1* | 1/2001 | Hiratsuka et al. ............. 429/90 |
| 6,356,948 B1* | 3/2002 | Barnett et al. ................ 709/236 |
| 7,184,905 B2* | 2/2007 | Stefan ......................... 702/63 |
| 2003/0139888 A1* | 7/2003 | Burns ......................... 702/63 |

* cited by examiner

*Primary Examiner*—Edward Tso
*Assistant Examiner*—M'Baye Diao
(74) *Attorney, Agent, or Firm*—Howrey LLP

(57) ABSTRACT

A battery monitoring system may be configured to interface with a first battery monitoring unit and a second battery monitoring unit. The first battery monitoring unit may be configured to output data in a first format. The second battery monitoring unit may be configured to output data in a second format, the second format being different than the first format. The battery monitoring system may include a first polling agent, the first polling agent may be configured to receive data from the first battery monitoring unit and normalize the data into a predetermined data format and store the data in a database. The battery monitoring system may also include a second polling agent. The second polling agent may be configured to receive data from the second battery monitoring unit and normalize the data into the predetermined data format and store the data in a database. Furthermore, the battery monitoring system may be configured to output data associated with the condition of a respective battery unit coupled to at least the first battery monitoring unit and the second battery monitoring unit.

6 Claims, 24 Drawing Sheets

FIG. 6

DATA POWER MONITORING CORPORATION
MO.USER [LOG-OUT]

REPORTS: ALARM SUMMARY

MAIN SCREEN

| | | | | | |
|---|---|---|---|---|---|
| Bank System: South Pwr Rm (system B1/1) | CELLWATCH | XT2LOP-23 | Normal | - | - |
| Bank System: South Pwr Rm (system B2/1) | CELLWATCH | XT2LOP-23 | Normal | - | - |
| Bank System: South Pwr Rm (system B3/1) | CELLWATCH | XT2LOP-23 | Normal | - | - |
| Bank System: South Pwr Rm (system B4/1) | CELLWATCH | XT2LOP-23 | Normal | - | - |
| Battery System 01 | BTECH | UPS12-370 | Maintenance Required | | |
| Battery System 02 | BTECH | UPS12-370 | Maintenance Required | Unit 49 | - |

- Battery Status
- Temperature
- Power Outages
- Poll Status

CLICK ON THE TEMPERATURE HYPERLINK TO VIEW TEMPERATURE GRAPHS.

| | | | | | |
|---|---|---|---|---|---|
| Battery System 11 | BTECH | UNIGY II | Normal | | ▫ Power Outages<br>▫ Poll Status |
| Battery System 12 | BTECH | XT4LOP-15 | Normal | | ▫ Battery Status<br>▫ Temperature<br>▫ Power Outages<br>▫ Poll Status |
| Battery System 13 | BTECH | UP56-620 | Maintenance Required | UNIT 21<br>UNIT 18 | ▫ Battery Status<br>▫ Temperature<br>▫ Power Outages<br>▫ Poll Status |
| Battery System 14 | BTECH | 4XTLCP-15 | Maintenance Required | UNIT 22<br>UNIT 17<br>UNIT 14 | ▫ Battery Status<br>▫ Temperature<br>▫ Power Outages<br>▫ Poll Status |
| Battery System 15 | BTECH | 4DX-118 | MONITOR | UNIT 19<br>UNIT 24<br>UNIT 22<br>UNIT 21<br>UNIT 50 | ▫ Battery Status<br>▫ Temperature<br>▫ Power Outages<br>▫ Poll Status |

CLICK ON THE POWER OUTAGE HYPERLINK TO VIEW DISCHARGE INFORMATION.

REPORTS: ALARM SUMMARY

MAIN SCREEN

File Edit View Favorites Tools Help  Send
Back  Search  Favorites  Media
Address: http://www.datapowermonitoring/cgi-bin/dpmc-reports-pd?type=history
Data Power Monitoring Reports and Analysis

TA POWER
ITORING CORPORATION
MO.USER [LOG-OUT]

rname: demo.user
etem shows 14 sites contain comments)

*A specific system can be chosen as well as a date range.*

Choose Site:
ALL SITES
Choose Date Range:
ALL DATES   [Search]

REPORTS: SERVICE HISTOR

MAIN SCREEN

SERVICE NOTES

| Filename | Timestamp | Comments |
|---|---|---|
| Alber Site | 2004-05-04 05:16:50 | Unit 34 below tolerance. Recommend to check and replace. |
| BA1-5 | 2004-06-28 10:11:21 | Unit 8 resistance critical, recommend to check and replace. |
| BA1-5 | 2004-06-28 10:11:41 | Unit 30 critical, recommend to check and replace. |
| BA1-5 | 2004-07-01 11:36:42 | Battery scheduled for replacement, date |
| BA1-5 | 2004-07-01 11:36:43 | Battery scheduled for replacement, date |
| demo system 01 | 2003-11-15 22:03:05 | test message. |
| demo system 01 | 2003-12-03 18:33:43 | Unit 29 trending. |
| demo | 2004-05-04 | |

FIG. 20

SYSTEM AND METHOD FOR REMOTE MONITORING OF BATTERY CONDITION

CROSS-REFERENCE TO RELATED APPLICATIONS

The present application is a divisional of U.S. application Ser. No. 11/002,257, filed Dec. 3, 2004 now U.S. Pat. No. 7,576,517 which claims priority to U.S. Provisional Application No. 60/631,165, filed Nov. 29, 2004. The above applications are hereby incorporated by reference in their entirety.

FIELD OF THE INVENTION

The present invention relates to monitoring the status of batteries. More particularly, the invention relates to the remote monitoring of batteries over a computer-based network.

BACKGROUND OF THE INVENTION

Many commercial and industrial industries utilize batteries to backup critical systems in the event of a power failure. Stationary batteries may be used for such a purpose. When power disruptions occur, the batteries employed by those in the commercial or industrial sectors are typically the first line of defense to prevent potentially devastating power disruptions to certain systems. Data associated with various battery parameters may be monitored to ensure that in the event of a power outage, the batteries will be ready for use in providing the power requirements for such systems. Thus, there are systems designed for the monitoring of the various parameters associated with batteries used in a system. These systems may be configured to collect data and interpret this data to ensure that the battery systems are properly maintained.

Conventional battery monitoring systems were configured to monitor stationary batteries using the battery monitoring technology that was deployed in the field, such as, for example, at the stationary battery site. These battery monitors included both hardware and software that was configured specifically for a given manufacturer's products. The majority of these functions are performed using an automatic, unattended capability. Measurements may be made automatically while the battery systems are on-line. These measurements and the methodologies employed by various algorithms for battery monitors varied across manufacturers. While these prior art systems permitted automatic review of a user's batteries, thereby substantially reducing the need for a manual battery monitoring routine, the data collected by such systems needed to be manually analyzed. Some exemplary data that is collected by traditional battery monitoring systems included, for example, voltage of cells, voltage of battery groups, or voltage of battery strings may be measured and recorded. Additionally, the current or battery AC or DC charge may be measured and recorded. Furthermore, parameters such as ambient temperature, cell or battery temperature, interconnection resistance, and internal resistance measurements may also be taken and recorded.

Some exemplary stationary battery systems include, for example, computer centers, telecommunication operations, smart facilities, process control, manufacturing operations, and other critical applications. Monitoring the batteries associated with the back-up power supplies in these systems may be costly and time consuming. Monitoring the battery operating parameters, as discussed above is essential to the proper maintenance of the battery systems for system critical applications. Thus, in the event that an emergency power situation arises, the batteries in the system will be ready for use.

Periodic manual monitoring, as is the status quo in traditional systems can provide only an indication of the battery condition. However, the conclusions drawn from the data collected may only be valid at the time at which the data was gathered. These manual prior art systems, while capable of automatic measurements of battery condition still deposited the data into a database for manual analysis by an engineer. Furthermore, reports would need to be generated based on the data reviewed manually. Finally, when multiple battery systems were used, some of which have different manufacturers and the monitors that were deployed in the field were not of the same make and model, the data that is collected from each battery monitor would need to be manually compiled by the user to obtain a complete picture of the battery performance. Furthermore, the compilation of the data is typically limited to flat text files or, at best spreadsheets for performing more detailed analysis. Thus, the traditional methods of monitoring battery conditions are both expensive and time consuming.

SUMMARY OF THE INVENTION

Thus, the invention is directed to an improved system and method for monitoring various characteristics of battery-based power systems.

A battery monitoring system may be configured to interface with a first battery monitoring unit and a second battery monitoring unit. The first battery monitoring unit may be configured to output data in a first format. The second battery monitoring unit may be configured to output data in a second format, the second format being different than the first format. The battery monitoring system may include a first polling agent, the first polling agent may be configured to receive data from the first battery monitoring unit and normalize the data into a predetermined data format and store the data in a database. The battery monitoring system may also include a second polling agent. The second polling agent may be configured to receive data from the second battery monitoring unit and normalize the data into the predetermined data format and store the data in a database. Furthermore, the battery monitoring system may be configured to output data associated with the condition of a respective battery unit coupled to at least the first battery monitoring unit and the second battery monitoring unit.

According to various other embodiments of the invention, the invention may include processor-readable software code stored on a processor-readable medium. The processor-readable software code may include code to receive data from a first battery monitoring unit, the data from the first battery monitoring unit being received in a first format. The processor-readable software code may also include code to receive data from a second battery monitoring unit. The data received from the second battery monitoring unit may be received in a second format, the second format being different than the first format. The code to receive the data from the first battery monitoring unit and the code to receive the data from the second battery monitoring unit may be configured to normalize the data into a predetermined data format. Furthermore, the processor-readable code may be configured to store the normalized data in a database. The processor-readable code may be configured to output information associated with the status of a battery unit associated with the first battery monitoring unit and the status of a battery unit associated with the second battery monitoring unit. According to an exemplary embodiment of the invention, the output may be configured to be output in .html or other web-displayable output, for example. According to yet another exemplary embodiment of the invention, the first battery monitoring unit may be associated with a first remote location and the second battery monitoring unit may be associated with a second remote location. According to yet another exemplary embodiment of the present invention, the first battery monitoring unit may be associated with a first account and the second battery monitoring unit may be associated with a second account. According to another aspect of the present invention, the first account may be associated with a username and/or a password and the second account may be associated with a second username and a password. The first account may be configured to permit access to the output associated with the first battery monitoring unit and the second account may be configured to permit access to the output associated with the second battery monitoring unit.

An exemplary method according to one aspect of the invention may include receiving data from a first battery monitoring unit at a battery monitoring system. The method may also include receiving data from a second battery monitoring unit at the battery monitoring system. The data from the first battery monitoring unit and the second battery monitoring unit may be in a first format and a second format, respectively. The method may include normalizing the data received from the first battery monitoring unit and the second battery monitoring unit so that the data received from each of the first battery monitoring unit and the second battery monitoring unit are in a predetermined format. Furthermore, the method may include storing the data in a database and outputting data associated with the status of a first battery unit associated with the first battery monitoring unit and data associated with the status of a second battery unit associated with the second battery monitoring unit.

BRIEF DESCRIPTION OF THE DRAWINGS

While the specification concludes with claims particularly pointing out and distinctly claiming the present invention, it is believed the same will be better understood from the following description taken in conjunction with the accompanying drawings, which illustrate, in a non-limiting fashion, the best mode presently contemplated for carrying out the present invention, and in which like reference numerals designate like parts throughout the Figures, wherein:

FIG. 6 shows a screen shot of a GUI according to an exemplary implementation of the present invention;

FIG. 8 shows an exemplary GUI according to another exemplary implementation of the present invention;

FIG. 10 shows a GUI according to another exemplary embodiment of the present invention;

FIG. 14 shows another screen shot of a GUI that an end-user may see upon logging into an exemplary embodiment of the system of the present invention;

FIG. 16 shows another screen shot of a GUI that may be displayed to an end-user upon logging into an exemplary embodiment of the present invention;

FIG. 17 shows a report that may be generated to provide the end-user with a battery replacement log;

FIG. 20 shows another screen shot of a GUI that may be displayed to an end-user upon logging into an exemplary embodiment of the present invention;

DETAILED DESCRIPTION OF THE INVENTION

Figure 1:
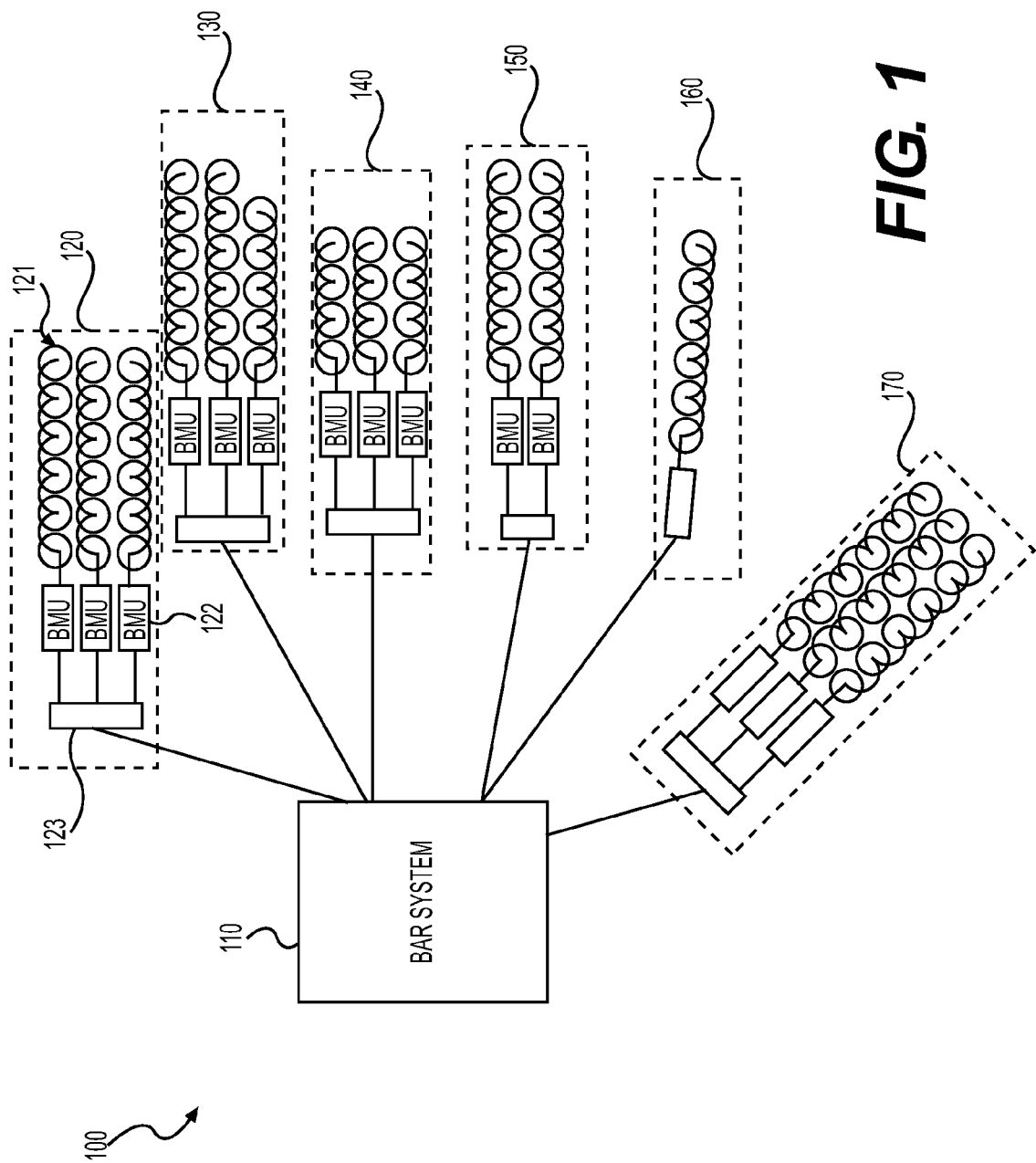
FIG. 1 shows an exemplary embodiment of the invention in which the system is configured to monitor multiple battery units at various remote locations.

The present disclosure will now be described more fully with reference to the Figures in which various embodiments of the present invention are shown. The subject matter of this disclosure may, however, be embodied in many different forms and should not be construed as being limited to the embodiments set forth herein.

The present disclosure will now be described more fully with reference to the Figures in which various embodiments of the present invention are shown. The subject matter of this disclosure may, however, be embodied in many different forms and should not be construed as being limited to the embodiments set forth herein.

One aspect of the present invention includes a system and a method for collecting and storing data associated with a variety of battery characteristics. The system may include a system for collecting data associated with the batteries and may include a system for storing various data associated with the batteries in, for example, a database. A user of the system of the present invention may receive data including, for example, alerts, failure predictions, aging items, and comprehensive battery management information, including, but not limited to, the replacement information relating to the last time a particular battery unit was replaced, the last time that the user logged into the system and received data associated with the battery, the internet protocol (IP) address and domain from which the user logged in from, as well as characteristics associated with the battery storage facility, including the ambient temperature of the battery storage facility.

The system may include a data gathering module and an analysis server module. The system may be configured to collect data using the data gathering module. The data gathering module may be configured to receive data associated with the various battery characteristics from a number of different battery monitor types. In this respect, the data gathering module may be essentially universal for the various battery monitor types. The data gathering module may be configured to gather data from the battery monitors throughout the system periodically, for example. While the data gathering module may be configured to retrieve data associated with the batteries periodically, the data gathering module may be instructed by a user to gather the data from the batteries. Alternatively, the data gathering module may be configured to receive a signal from a remote location after the occurrence of an event and may receive information associated with the batteries being monitored after the occurrence of a predetermined event. For example, the data gathering module may be configured to receive data associated with the batteries after the temperature in the storage area exceeds a predetermined temperature. Alternatively, the data gathering module may be configured to receive or otherwise gather data associated with the batteries after the occurrence of a power surge, for example. Additionally, the data gathering module may be configured to receive or otherwise gather data associated with the batteries after the occurrence of a change in temperature that exceeds a predetermined amount, for example. Data collection and reception by the data gathering module may be triggered by any number of events.

According to one embodiment of the present invention, the system may be configured to display the data associated with the batteries in a convenient executive summary format. According to one embodiment of the invention, the executive summary format may be the same across all types of battery monitor platforms. Thus, the user may be provided with a consistent feedback for all the batteries system wide, regardless of the monitors being used. This may be particularly convenient for an end-user that has a variety of battery monitors for monitoring a variety of systems.

According to one aspect of the invention, the data received from the battery monitors throughout the system may be stored in a database and archived. This data may also be input into one or more relational databases. This data is typically received from remote battery sites having battery monitoring equipment for monitoring the batteries locally.

The database may be configured to hold a variety of information related to the batteries being monitored and the site, as well as the end user of the system. For example, collected data from the battery monitoring sites may include historical battery and stationary battery data, as well as site-specific data associated with the battery site and not necessarily the batteries. Such site-specific data may include, for example, the location of the site and the contact information for the user that is responsible for monitoring the batteries. Further information that may be stored in one or more of the databases includes, for example, the type or model of the battery being used at a particular location as well as client-defined threshold values for certain battery-related characteristics. The data stored in a database and associated with the various batteries at one or more sites may include, for example, site configurations, battery replacement dates, battery specifications, and notes regarding suggested courses of action for maintaining the batteries associated with a site. The data contained with the database or databases may be organized, analyzed, and placed into report generators, such as an algorithm or template for producing a report in a manner dictated by the end-user, for example. The report generators may be configured to output reports that are viewable by a user via a graphical user interface (GUI). The reports may be transmitted from, for example, a data processing location and may be displayed on a GUI at the end-user's location. The data associated with the various battery sites may be transmitted over an encrypted or an unencrypted data link over, for example, the Internet.

Additional reports may be generated and may include battery life prediction information and may also include alarm data. Various characteristics or conditions may be reported, and the invention is not to be construed to be limited to a particular report configuration. In one embodiment of the present invention, the reports may be generated based on a query by, for example an end-user or an end-user's workstation. In an alternative embodiment of the present invention, reports may be pushed to an end-user over a network based on the occurrence of a predetermined event, such as, for example, a power outage, a power surge, or a change in temperature of the battery storage site. These characteristics are merely exemplary of the types of triggering events that may result in a report being pushed to a user. According to another embodiment of the present invention, the reports may be pushed to a user periodically, such as, for example, every 15 minutes, every half-hour, every hour, four times a day, etc. The period for reporting may be either a preset periodic reporting function or may be determined by the end-user. Alternatively, one or more system analysis modules may determine what is available to the users and what data is pushed to the user in terms of alarms and data, for example. The concept of system analysis modules will be discussed in more detail below.

Calculation modules may determine various characteristics of the batteries being monitored. For example, various trends, such as the environmental temperature at which the batteries are being stored in, the operating voltage or current of the batteries, or the time period for which the batteries have actually been used to power the end-user's system may be monitored and, for example, trends may be calculated based on historical data stored in the database. This historical data may be received from the battery monitoring unit by the data gathering module or modules. In addition to determining or calculating trends, the calculation module or modules may be configured to determine or predict the relative longevity or lifetime of the batteries at particular storage site.

The system analysis module may be configured to collect data associated with the batteries being monitored and may interpret trends produced by the calculation modules. Additionally, the system analysis may also include a means for identifying battery failures and/or predicting battery failures. The means may be, for example, the battery monitoring means. Alternatively, the means for identifying or predicting battery failures may be processor-readable software code that is configured to perform calculations based on input parameters associated with the batteries being monitored to determine or predict a battery failure. The system analysis modules may also be configured to collect and/or identify battery maintenance data and may recommend maintenance actions from the routine level, to the emergency level. According to one exemplary embodiment of the present invention, the system may be configured to provide these recommendations regarding maintenance in a number of predetermined levels. According to one embodiment of the present invention, one level may be based on thresholds that may be set by, for example, the administrator. Based on these thresholds, alarms may be generated to, for example, a defined user or set of users. According to one aspect of the present invention, the web-based pages that may be displayed to a user may be color-coded based on the type of maintenance needed, such as, for example, routine maintenance or emergency service. Furthermore, according to one embodiment of the invention, the end-user may be permitted to alter the thresholds or override the display colors. A second predetermined level may be, for example, a high-level data display configured to be reviewed and interpreted by the end-user. Furthermore, this level may be interactive and permit the end-user to enter notes associated with a particular battery unit or a location, for example. These notes may be applied to a given site, for example and may be viewable by designated users. According to one embodiment of the present invention, all users may be permitted to read the notes while a subset of the users associated with a particular end-user customer (e.g., a company or client) may have the required permissions to write data to the notes section. Alternatively, all users associated with the end-user may have the read and write permissions. This may be determined by the end-user. All data may be presented to a user in, for example, digital form, analog form, or graphical form (which may be either digital or analog form), or any combination thereof.

The system of the present invention may include a graphical user interface ("GUI") that is generated by the system. The GUI may permit a user to access various information associated with the batteries over a web-based interface using, for example, a traditional web browser, such as, for example, Netscape® or Microsoft Internet Explorer®. Other web-based interfaces may also be used in connection with the present invention, such as, for example, micro-browsers as may used in connection with personal digital assistants (PDAs) or cellular phones. The GUI may permit the end-user to perform a variety of functions related to the batteries being monitored. For example, the end-user may update the specifications of the batteries being monitored or the end-user may enter maintenance data, such as when the battery has been replaced. Additionally, the GUI may include an instant messaging module that permits an end-user to instant message or electrically mail an administrator.

The data gathering module may automatically collect stationary battery data from remote systems, such as remote battery monitoring units and may further be configured to collect data that is uploaded into the data gathering module manually by, for example, an end-user. The data collecting module may accept and display battery data from battery monitoring modules, such as, for example, portable battery unit testing devices, which may be configured to gather various data points, such as, for example, voltage, resistance measurements (ohmic), temperature, and radio frequency measurements associated with a battery unit. Such a configuration permits uses to trend battery data from routine preventative maintenance visits. The data gathering module may be configured to query systems over, for example, a TCP/IP network or via a dial-up modem. Furthermore, the data gathering module may optionally be configured to standardize the data into a particular format before storing it in one or more of the databases. Standardization may include, for example, file format for the data, standardization of units of measure, including, for example, temperature, time, voltage, or current. Various other standardizations are possible and will be readily understood by one of skill in the art based on the examples provided herein.

The system may also include an analysis server module. The analysis server module may be configured to retrieve data from one or more of the databases and may perform various analyses using the stored data received by the data gathering module. Thus, the analysis server module may be configured to identify or flag systems that are either in an alarm state are within a predetermined tolerance of an alarm state. The server module may be configured to implement a security function, including the implementation of a login algorithm which may be configured to prompt a user for a username and a password prior to access specific battery data. A specific user name may be uniquely associated with a password and may also be uniquely associated with a particular view that may be customized for that user.

Battery Automated Reporting (BAR) System. The BAR system may be configured to interact directly with a particular end-user's battery monitoring systems. This interaction may be performed on a periodic basis, for example. Alternatively, this interaction may be specified by the system, as discussed above. This may occur when a predetermined event occurs, such as, for example when a battery fails. The BAR system may be configured to query the local battery monitoring systems. The BAR system may be configured to query the local battery monitoring systems using, for example, a modem (i.e., dial-up) or may be configured to query the local battery monitoring systems using a TCP/IP network via the Internet.

The systems, methods, and processor-readable software code algorithms described herein may be based on the collection of data from battery monitors and may include algorithms for monitoring the batteries, archiving the data received from the batteries, trending historical data received from the battery monitoring units, and analysis of the data. This analysis may be performed by applying industry standards for determining the characteristics and status of batteries. Such industry standards may include, for example, IEEE standards or other industry battery standards or specifications associated with the batteries. Intelligent dispatch and service of the battery systems may be provided to the user. The dispatch system may be provided based on each end-user's requirements and communication preferences. For example, the BAR system may be configured to provide e-mail dispatch to any e-mail addresses, including wireless devices, or, for example, pager notification supporting various pager communication protocols. A more detailed notification may be delivered by wireless delivery to a resident client on a wireless device capable of handling a third party integrated applications (e.g., a cellular phone supporting Java, Qualcomm BREW, Symbian OS, or Microsoft Pocket PC). These communications may be based on specific events taking place in certain timeframes and/or meeting predetermined or user-defined thresholds. The end-user may rely on a maintenance schedule, such as for example a preventative maintenance (PM) schedule, repair maintenance (RM) and/or an emergency maintenance (EM) when performing battery replacement and maintenance tasks. Intelligent dispatch and service (IDS) may permit the end-user to adopt a condition based maintenance (CBM) program. The CBM program may use information from the BAR system to reduce the frequency with which the end-user will have to perform PM, RM, or EM. CBM programs may be used to reduce the amount of time expended (and hence the man power requirements) of operation of the system. IDS may be configured to be an integral part of a CBM program.

This system may be, for example, web-based. A web-based system according to one embodiment of the present invention may provide an end-user with low cost means for monitoring the various characteristics and status of the batteries within a system. When battery monitoring is supplemented with an on-going battery monitoring and maintenance program, the end-user may be notified of system critical battery back-up status and be prepared to change the batteries in the event of a power outage, thereby improving the ability of the end-user to prevent a potentially catastrophic battery failure.

This BAR system may provide a link between the end-user and the batteries used to back up the end-users systems in the event of a power failure. This may permit the user to properly assess the battery health in conjunction with an automated gauge of the system health.

The BAR system may include a polling mechanism. The polling mechanism may be modular in design. This modularity in the design of the polling mechanism may permit new polling modules to be added for existing or future battery monitoring systems. The polling mechanism may be embodied as software and may be configured to utilize a processor and modem to perform its functions. Additionally, each polling mechanism may be uniquely associated with a predetermined make and model of the local battery monitoring unit. Thus, the polling mechanisms are not necessarily the same in the BAR system because the BAR system is configured to monitor multiple types of battery monitoring units that are deployed at remote locations.

The BAR system may be configured to be modular, allowing the polling mechanism to be created as an independent piece of software that may be tailored to a specific battery system. The individual module may attempt to connect to a given system. According to one embodiment of the invention, if the module finds that there are more than one system utilizing the same IP address or phone number, it may be configured to bundle the two connections into one connection, thereby saving polling time. If the module finds that the battery monitoring unit or system is reachable, then the module may be configured to query the system, gather data, format it into a predetermined BAR system format (e.g., converting temperatures to Fahrenheit or making sure that amperes of current are stored as milliamps). Furthermore, the module may be configured to store the data in association with a time stamp related to the time that the data was obtained. Furthermore, according to an exemplary embodiment of the present invention, the module may be configured to check to see if any alarms have been triggered. If so, the system may communicate this fact to the end-user, via e-mail, phone call, or other communication means. In addition, a polling module may also be configured to look for any data that has been uploaded to the system—either by a user manually doing so, or in some case a battery monitoring unit or system may be set to automatically upload the data rather than have the BAR system directly poll it. The polling module may be configured to treat this uploaded data as if the polling module has polled the battery monitoring system or unit.

Thus, a system according to one embodiment of the present invention may permit communication with battery monitors from any location in the world where web access is available. A system implementing one embodiment of the present invention may include, for example, one or more secure servers. According to one embodiment of the present invention, the servers may be co-located at one site or geographic location. Alternatively, the servers may be distributed throughout the nation or may even be distributed globally.

According to one embodiment of a system according to the present invention, the system may be configured to receive information from battery monitoring units constantly over an indefinite period. Alternatively, the system may be configured to receive data from various battery monitoring units periodically. The period may be any period, including, for example, every five seconds, every minute, every hour, etc. In an embodiment in which the system is configured to receive data constantly, the system will be provided with the most robust data, whereas in an embodiment of the system in which the system receives information, every 30 seconds form a battery monitoring unit, the data is less robust. Likewise in an exemplary embodiment of the invention in which the system receives data from the battery monitoring unit every 5 minutes, the data is even less robust. The present invention may be configured to receive information from various battery monitors. These battery monitors may be configured to monitor a multitude of different batteries and jars. Thus, the system of the present invention may be adapted to monitor a large number of batteries and may be scalable depending on the number of batteries to be monitored.

According to an exemplary embodiment of the invention, the system may be configured to monitor one or more battery units and may be scalable to monitor additional battery units depending on the number of battery units to be monitored. FIG. 1 shows an exemplary embodiment of the invention in which the system is configured to monitor multiple battery units at various remote locations. As shown in FIG. 1, a centrally located Battery Automated Reporting ("BAR") system 110 may be part of a battery-monitoring network 100. The BAR may be configured to receive data associated with various batter characteristics from battery sites located at various remote locations, 120, 130, 140, 150, 160, 170. The various remote locations 120, 130, 140, 150, 160, 170 may be, for example, spread throughout a state, a nation, or the world, for example. Each remote location may include at least one battery monitoring unit (BMU) 122. These battery monitoring units 122 may be configured to monitor the batteries locally and may interface with, for example a network. The battery monitoring units 122 may be configured to interface with the network using COTS components or they may include network access within the hardware provided by the manufacturer. The battery monitoring units 122 may be configured to monitor the status of the batteries 121 at a given location. According to one exemplary embodiment of the present invention, multiple battery monitoring units 122 may be installed and utilized at a particular remote location 120. Thus, the BMU's 122 may be configured to send the data associated with the batteries 121 that the BMU 122 is monitoring through a network router for transmission to the BAR system. The data may be either pushed or pulled by the BAR system through the network. Additionally, according to one exemplary embodiment of the present invention, an adapter may be configured to be located as an interface between the BAR system 110 and the individual battery monitoring units 122 to permit the BAR system 110 to interface with the battery monitoring units 122. This may be particularly useful in situations in which the battery monitoring units 122 do not have independent operating systems. The battery monitoring units 122 may each have a network interface card (NIC) that permits them to interface with the network and transmit information to the BAR system 110. This NIC or modem may be standard on the battery monitoring unit or may be required to be added to the unit to permit network interfacing. The data may be transmitted from the battery monitoring unit 122 to the BAR system over an encrypted or proprietary data stream. Additionally, as will be described in more detail below, the data may be transmitted to the user over a web-based interface in an encrypted manner. Additionally, as will be described in more detail below, the system may be configured to authenticate the IP address of the dial-up modem number uniqueness thereby preventing unauthorized access to the BAR system 110. FIG. 1 shows a number of remote locations 120, 130, 140, 150, 160, 170 with a number of different batteries that may be, for example, of different types voltages, etc. Additionally, the various remote locations may have a different number of BMU's 122 and different numbers and types of batteries 121. Additionally, while not shown in FIG. 1, the BAR system may be configured to receive data from as many as hundreds of thousands or more batteries throughout the nation or the world.

Figure 2:
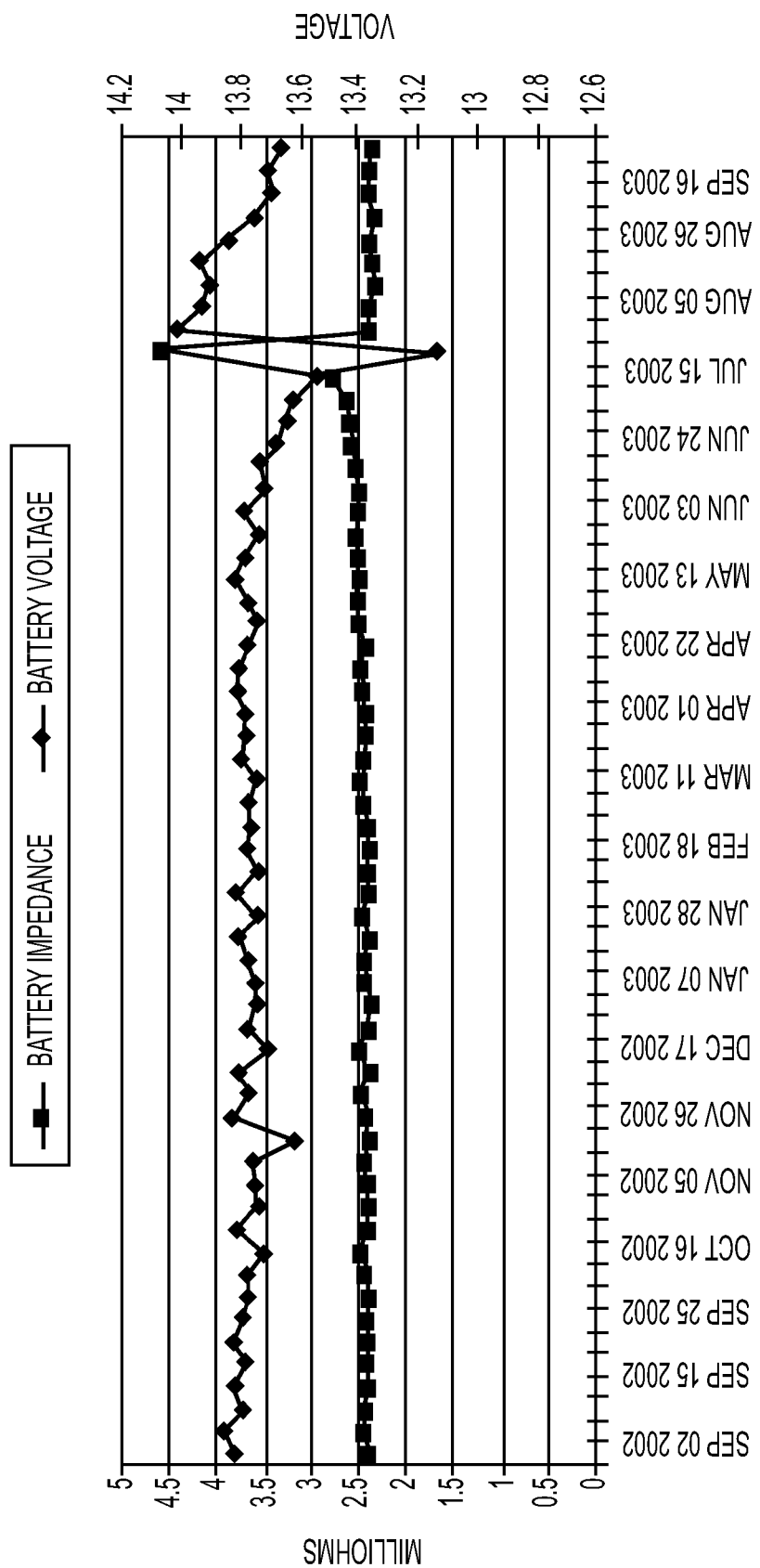
FIG. 2 shows an exemplary trend that may be produced by a BAR system according to one embodiment of the present invention.
Figure 3:
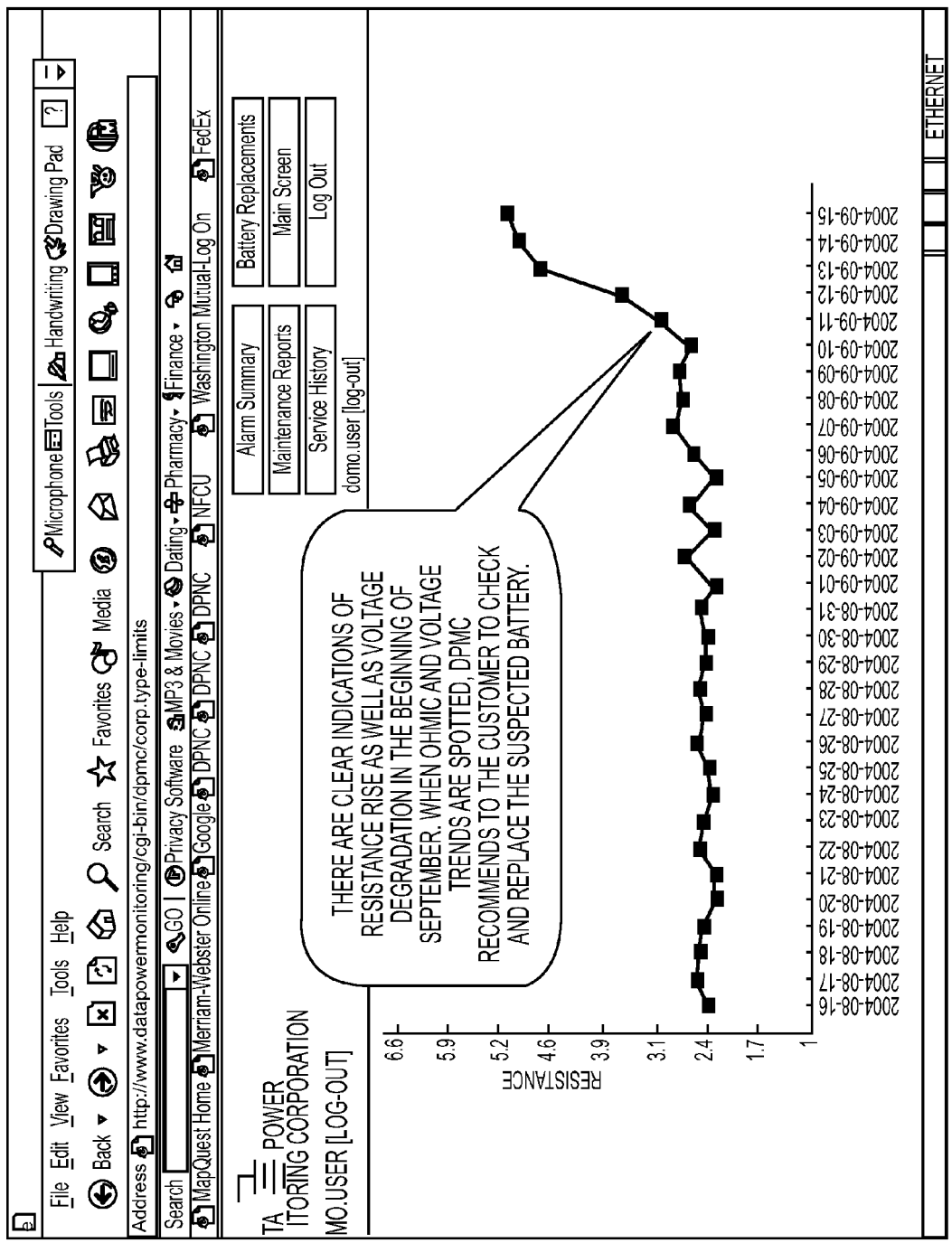
FIG. 3 shows another example of a trend plot that may be presented to an end-user according to an embodiment of the present invention.

The BAR system may be configured to perform a detailed analysis of the stationary batteries from the individual battery strings, to the battery cell or jar level. A jar may be a physical battery unit containing a cell or multiple cells. May not be an issue here Each system may have their own set of database tables that store, among other things, a unique battery unit identifier, such as, for example, a number, and an identifier associated with the battery string to which the battery unit is attached. This analysis may include a trending analysis of each cell or jar for its entire usable life. FIG. 2 shows an exemplary trend that may be produced by a BAR system according to one embodiment of the present invention. As shown in FIG. 2, between the months of July and August, there was a significant decline in the battery voltage and a sudden rise in the impedance of the battery unit. This indicates that the particular battery unit is weakening and may require replacement. Thus, the BAR system may provide an end-user with historical data trends reflecting the performances of the batteries in a particular string. FIG. 3 shows another example of a trend plot that may be presented to an end-user according to an embodiment of the present invention. As is shown in the exemplary screen shot of a trend line, the trend line shows indications that the resistance has risen as well and a degradation of voltage has resulted in the beginning of September as show in the exemplary screen shot. Based on these trends, the end-user may be notified that they should check and/or replace the suspect batteries in their battery-based systems.

Figure 4:
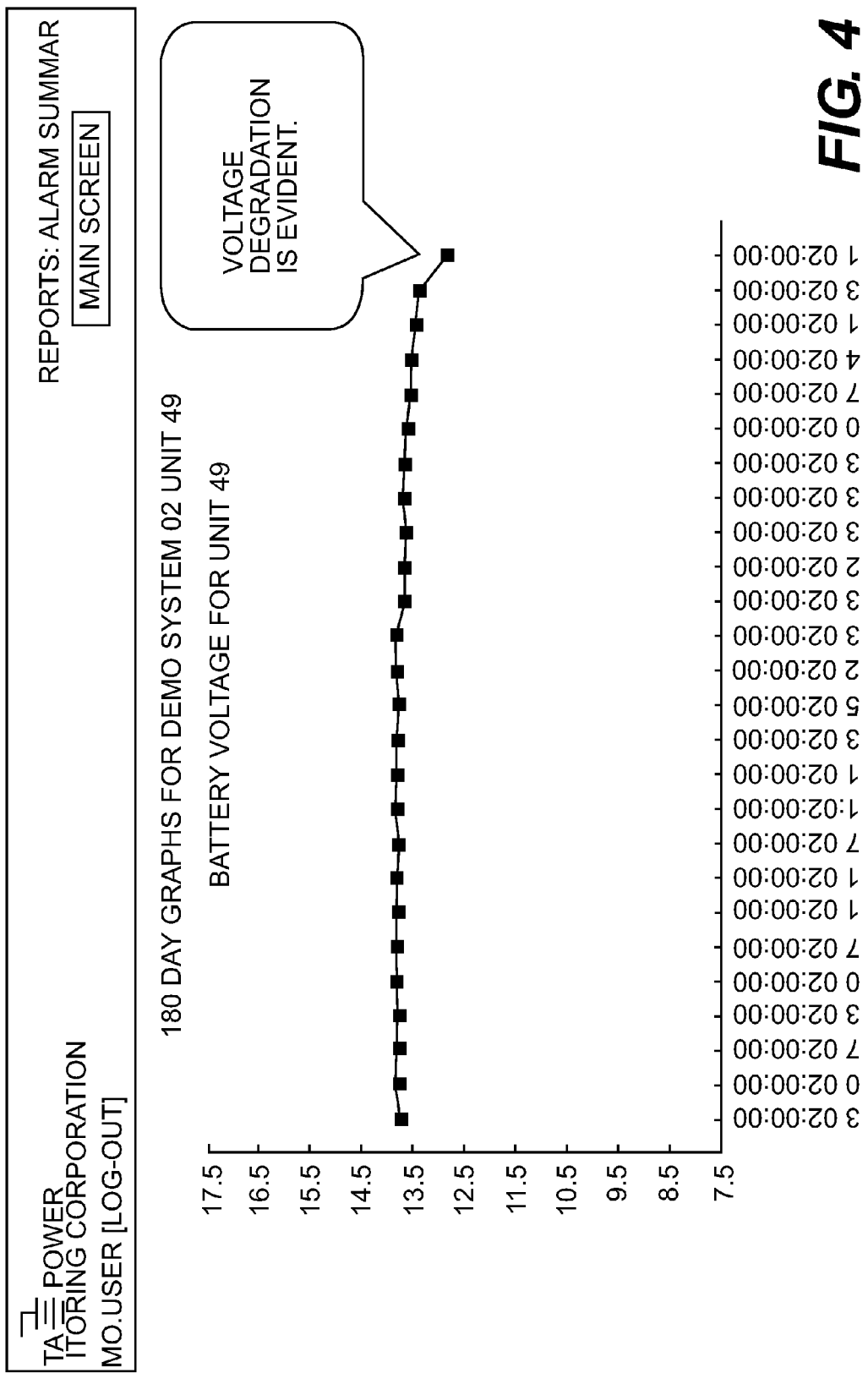
FIG. 4 shows another exemplary trend plot that may be displayed by a user according to another aspect of the invention.
Figure 5:
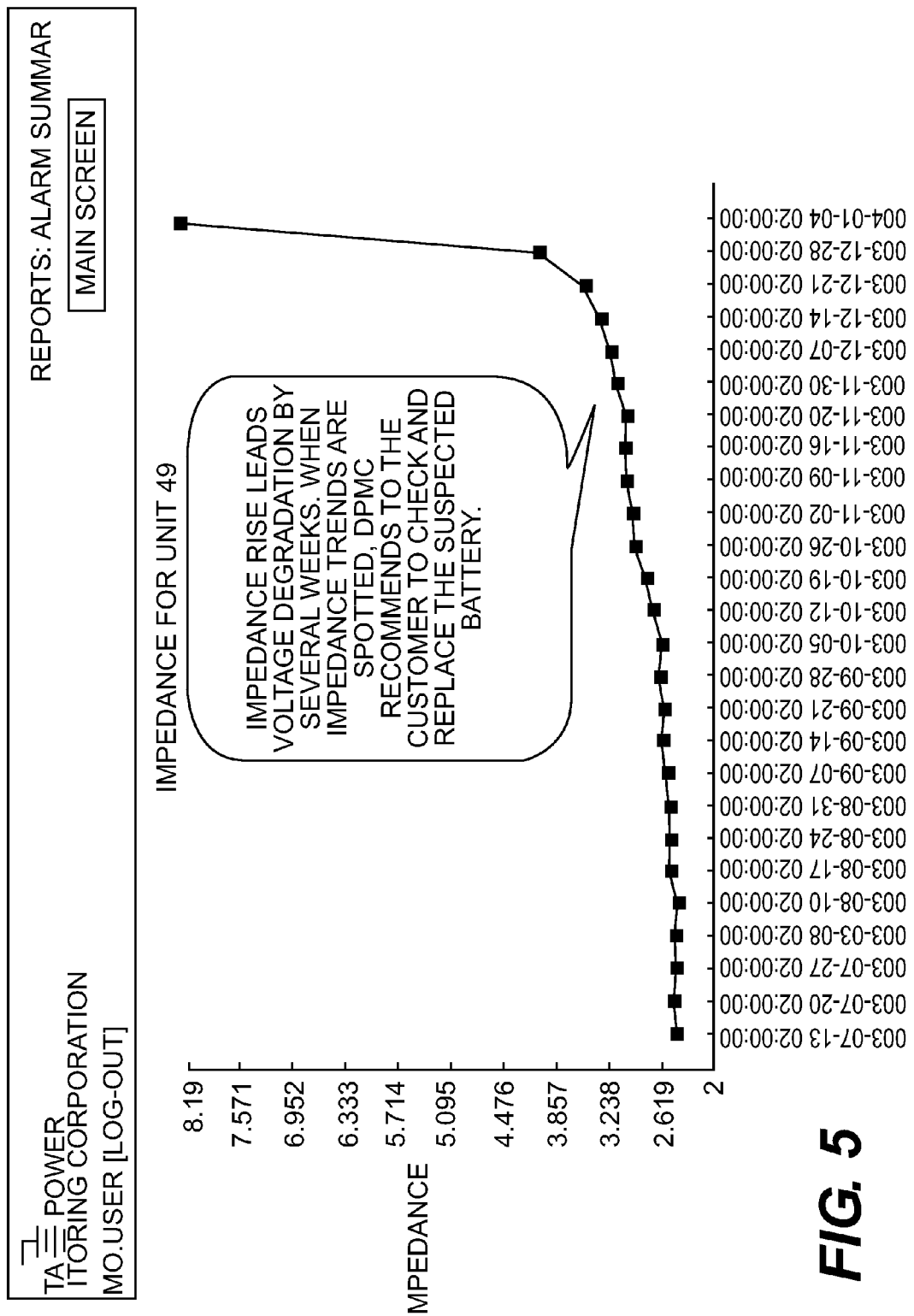
FIG. 5 shows another screen shot of a trend plot generated according to an exemplary embodiment of the invention.

FIG. 4 shows another exemplary trend plot that may be displayed by a user according to another aspect of the invention. The trend plot shown in FIG. 4 shows a 180-day trend for battery voltage associated with a particular battery unit. A battery unit as used herein may include individual batteries or jars. As can be seen from the trend plot shown in FIG. 4, the battery is beginning to degrade, as shown by the sudden decrease in voltage and should be replaced. FIG. 5 shows another screen shot of a trend plot generated according to an exemplary embodiment of the present invention. As can be seen in FIG. 5, a sharp increase of impedance illustrated in the trend line can provide an indication to the user that they should replace the battery or at the very least investigate the matter further.

Figure 7:
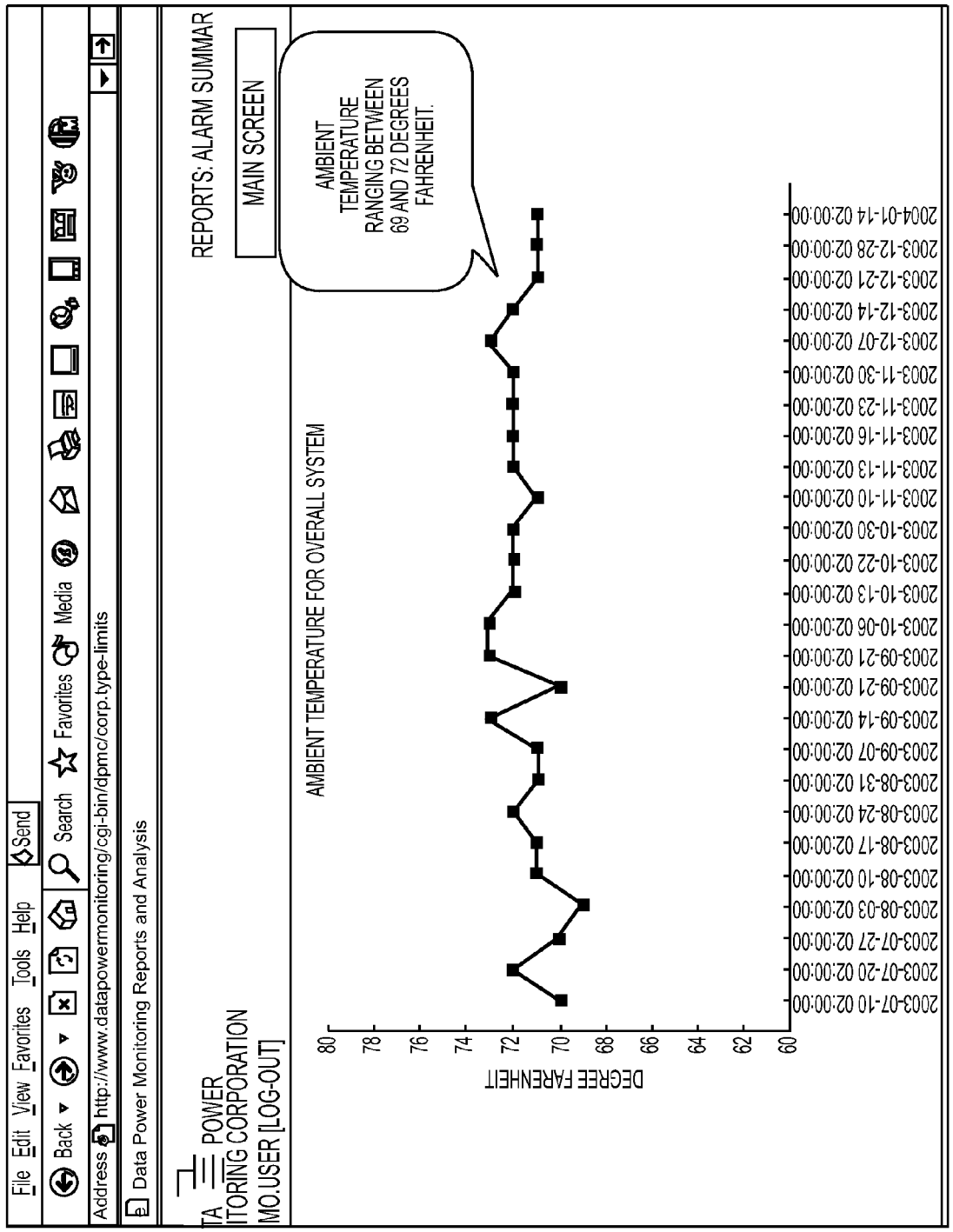
FIG. 7 shows an exemplary trend plot that may be displayed when the user clicks on the "temperature" reference.

FIG. 6 shows a screen shot of a GUI according to an exemplary implementation of the present invention. The GUI shown in FIG. 6 includes a number of hyper-links to data that the end-user may wish to access. As shown in FIG. 6, a list or table of data associated with each of the banks of batteries at a given remote location (or across a number of remote locations) may be displayed to the end-user. The GUI may include a number of hyperlinks that allow the user to either view more data for a given battery or string of batteries, or may view data associated with the geographic location, or may even permit the user to obtain real-time information by polling the remote location for information associated with the operation of the battery. For example, the end-user may click on the hyperlink associated with the "temperature" function to have the temperature of the remote location displayed on the screen. FIG. 7 shows an exemplary trend plot that may be displayed when the user clicks on the "temperature" hyperlink. As shown in the trend plot of FIG. 7, the ambient or environmental temperature of the remote location has historically been between 69 and 73 degrees. This data may be important because of the potentially deleterious effects that may occur if the temperature is allowed to vary too much over time.

Figure 9:
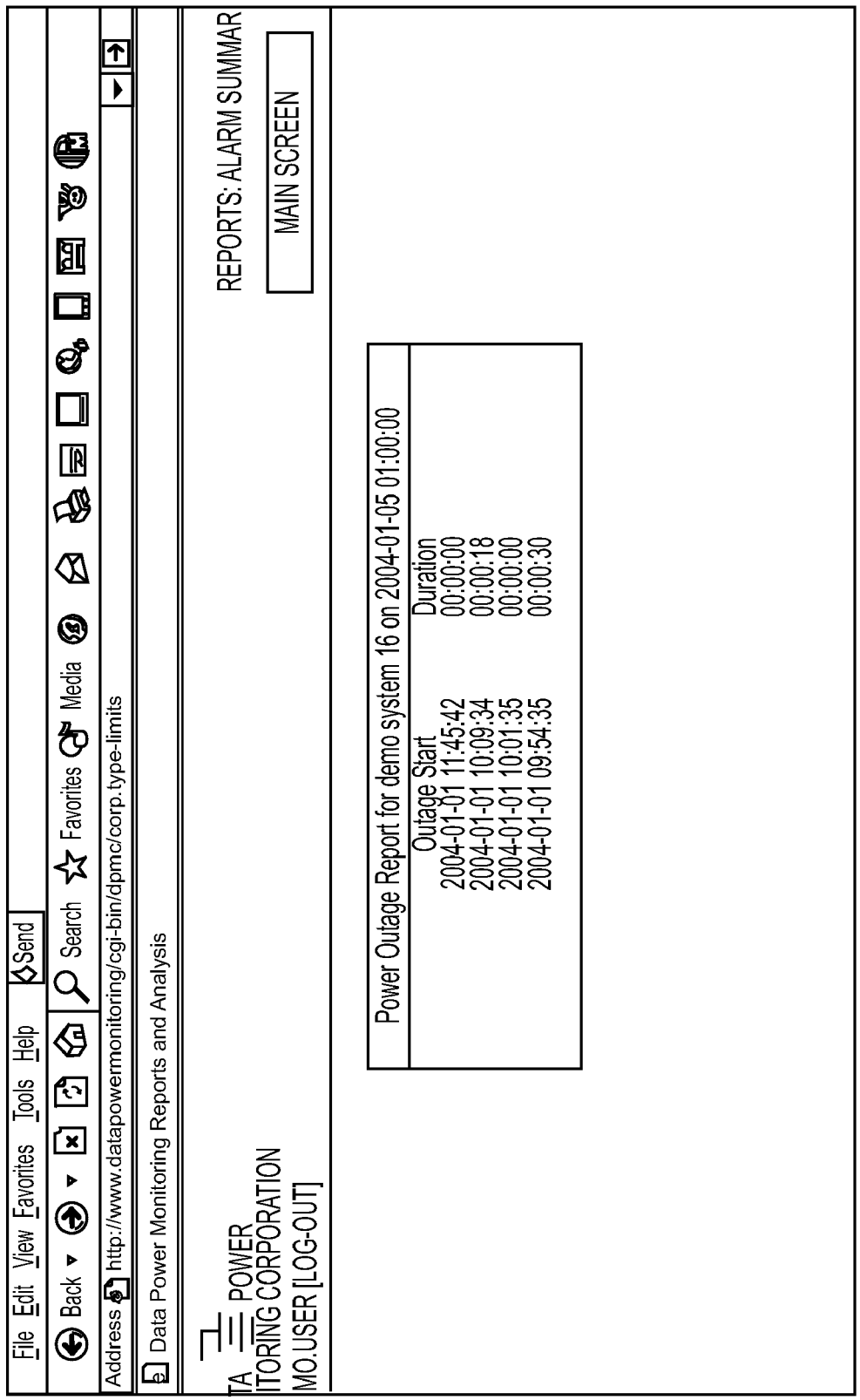
FIG. 9 shows another exemplary embodiment of a GUI according to another exemplary embodiment of the present invention.

FIG. 8 shows an exemplary GUI similar to that shown in FIG. 6. The user may click on the "power outage" hyperlink. This power outage hyperlink may provide the end-user with the screen shown in FIG. 9, for example. As shown in FIG. 9, the GUI may be configured to display a table related to power outages to the end-user. In addition to the power outage associated with the particular batter, string of battery or remote location selected by the user at the screen shown in FIG. 8, the user may be provided with information related to the duration of the power outage, as shown in FIG. 9.

Figure 10:
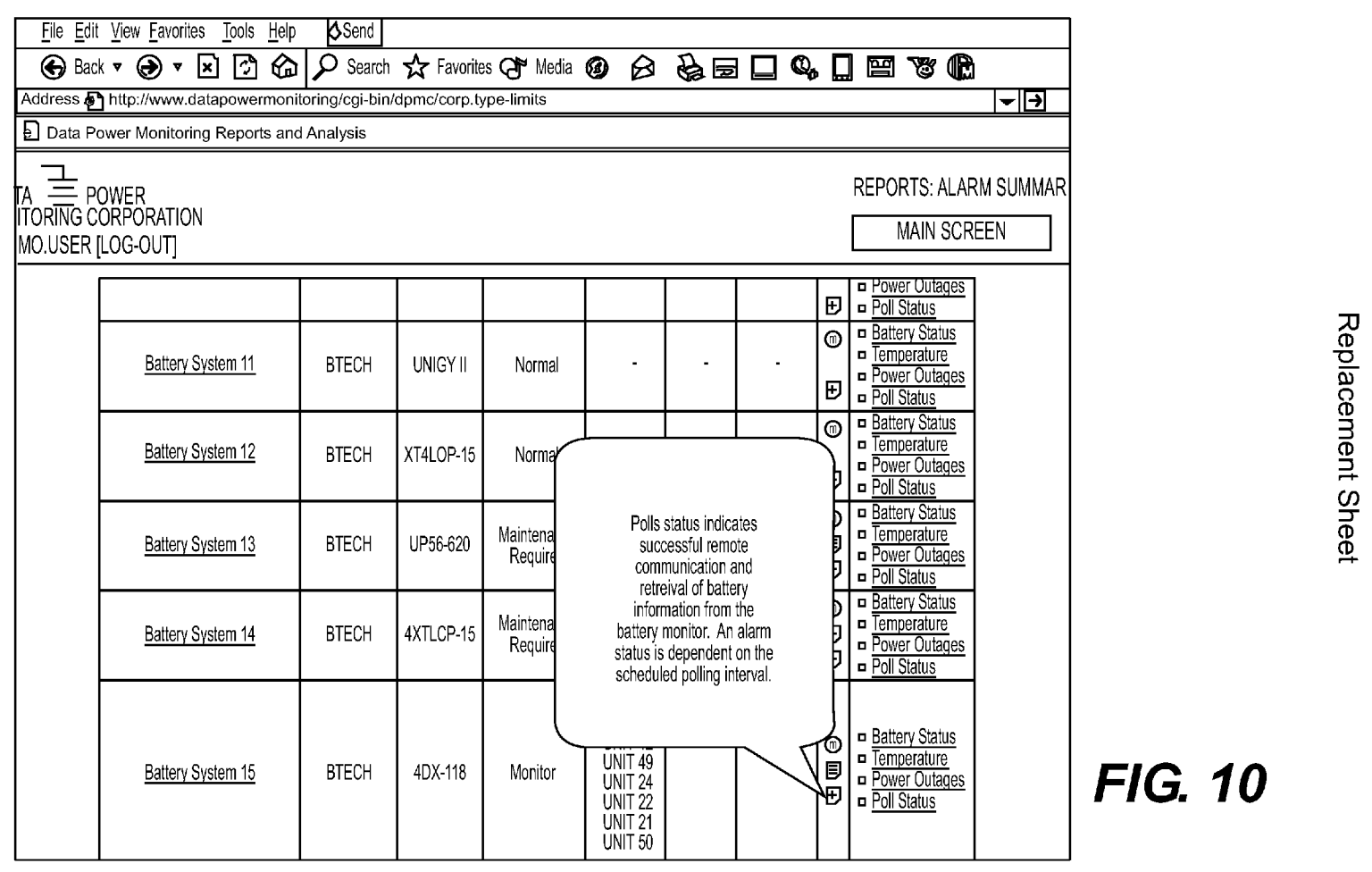
Figure 11:
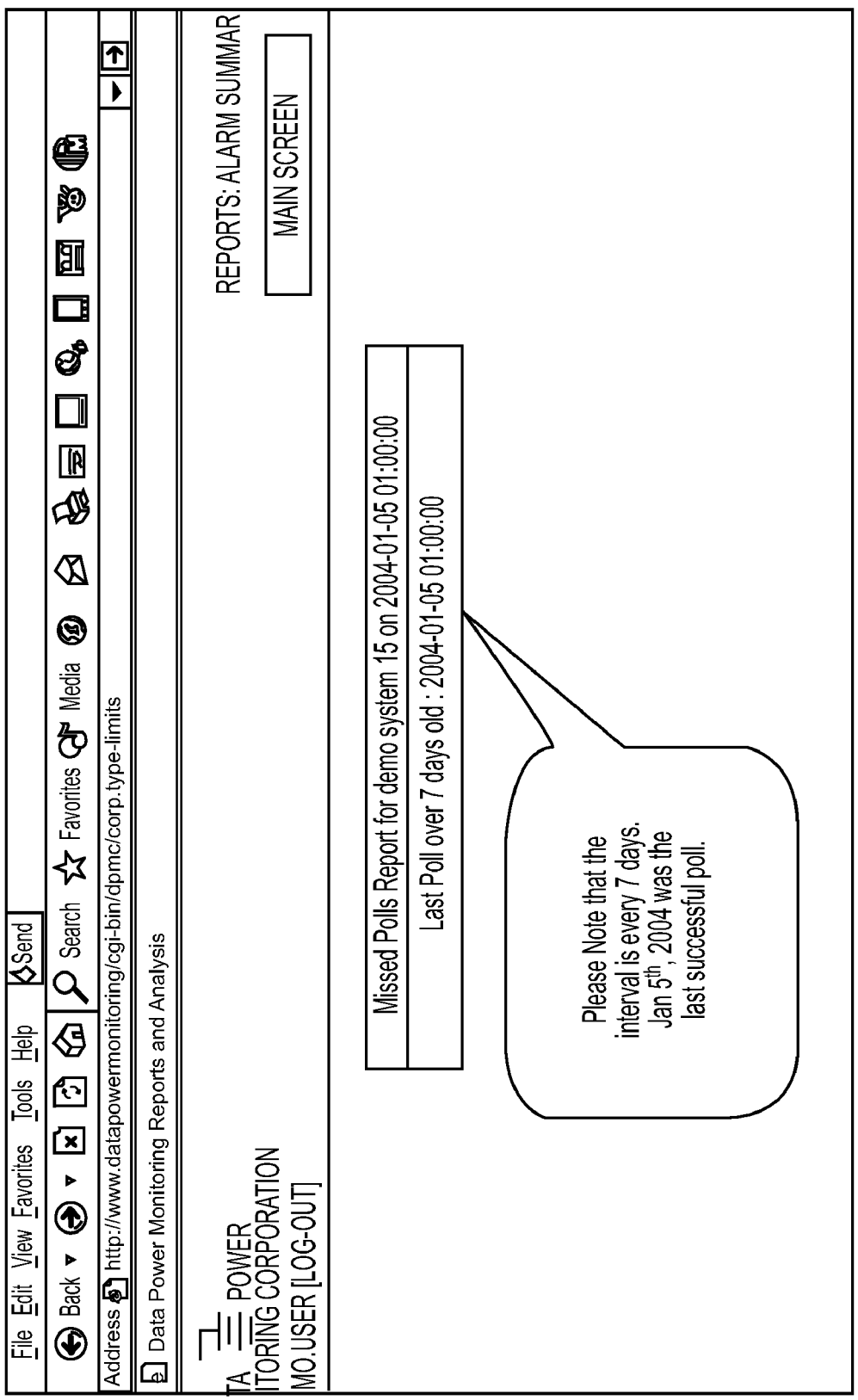
FIG. 11 shows an exemplary implementation of GUI according to yet another embodiment of the invention.

FIG. 10 shows a GUI similar to that shown in FIGS. 6 and 8. The end-user may select the hyperlink associated with the polling status function to determine if the communication path between the battery monitoring unit at a remote location is properly communicating with the BAR system. FIG. 11 shows a screen shot of the display that may be provided to the user when the polling status reference is activated on the GUI shown in FIG. 10. In the exemplary implementation shown in FIG. 11, the time between polling is 7 days. Of course, this is intended to be merely exemplary and the time period between polling of the battery monitoring units may be more or less than seven days. For example, the time between polling may be 6 hours, 24 hours, or one month. Alternatively, the battery monitoring units may be polled for example, once a minute. The time between polling of the battery monitoring units will depend at least in part on the available bandwidth and the system processor budget. As shown in the exemplary screen shot of shown in FIG. 11, the user may receive information that the battery monitoring unit was not properly polled the last time the BAR system polled the battery monitoring unit. Although not shown in this embodiment of the invention, the user may be provided with the option of polling the battery monitoring unit by activating a reference that instructs the BAR system to poll the battery monitoring unit.

In addition to providing textual hyperlinks in the high-level GUI shown in FIGS. 6, 8, and 10, the GUI may also include a number of graphical icons that may be activated so that the user may be provided with windows including data related to the operation or various characteristics associated with the batteries being monitored at the remote location. For example, the end-user may click on an icon and may retrieve a page that provides various site measurements. For example, the site measurements may include the voltage and impedance measurements for various battery units or jars within the system. In this mauler, the end-user can determine which units, if any are malfunctioning or should be replace or otherwise monitored or investigated further.

Figure 12:
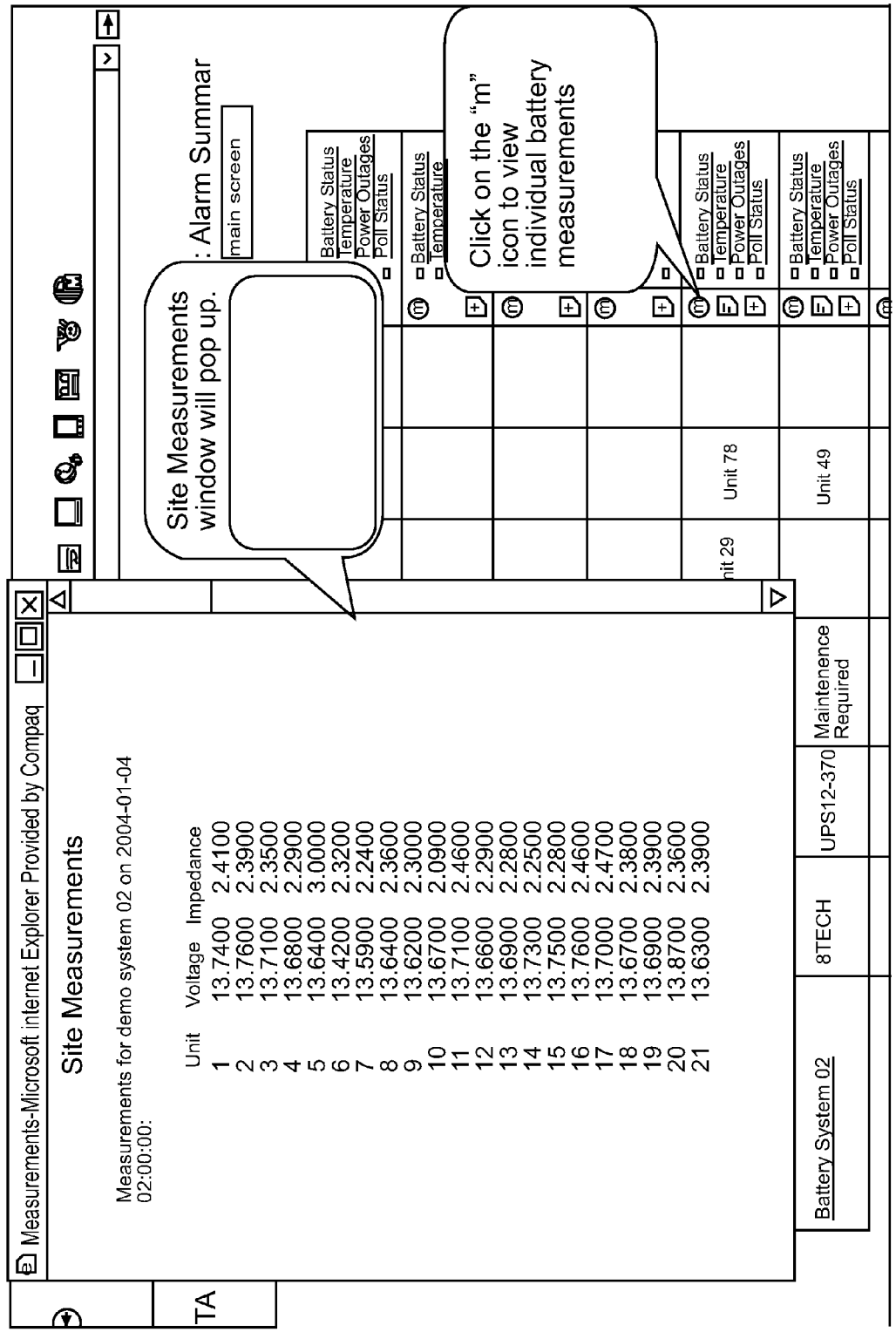
FIG. 12 shows another exemplary implementation of a GUI according to another embodiment of the invention.

As shown in FIG. 12, the user may be presented with data uniquely associated with each battery unit connected to a given battery monitoring unit according to one embodiment of the invention. In the exemplary embodiment of the invention shown in FIG. 12, the user may be presented with data associated with the voltage and the impedance of battery units being monitored by the battery monitoring units. The information may be configured to display in a pup-up window as shown in FIG. 12. This data may be accessed by clicking or otherwise activating a reference, such as, for example, a hyperlink.

Figure 13:
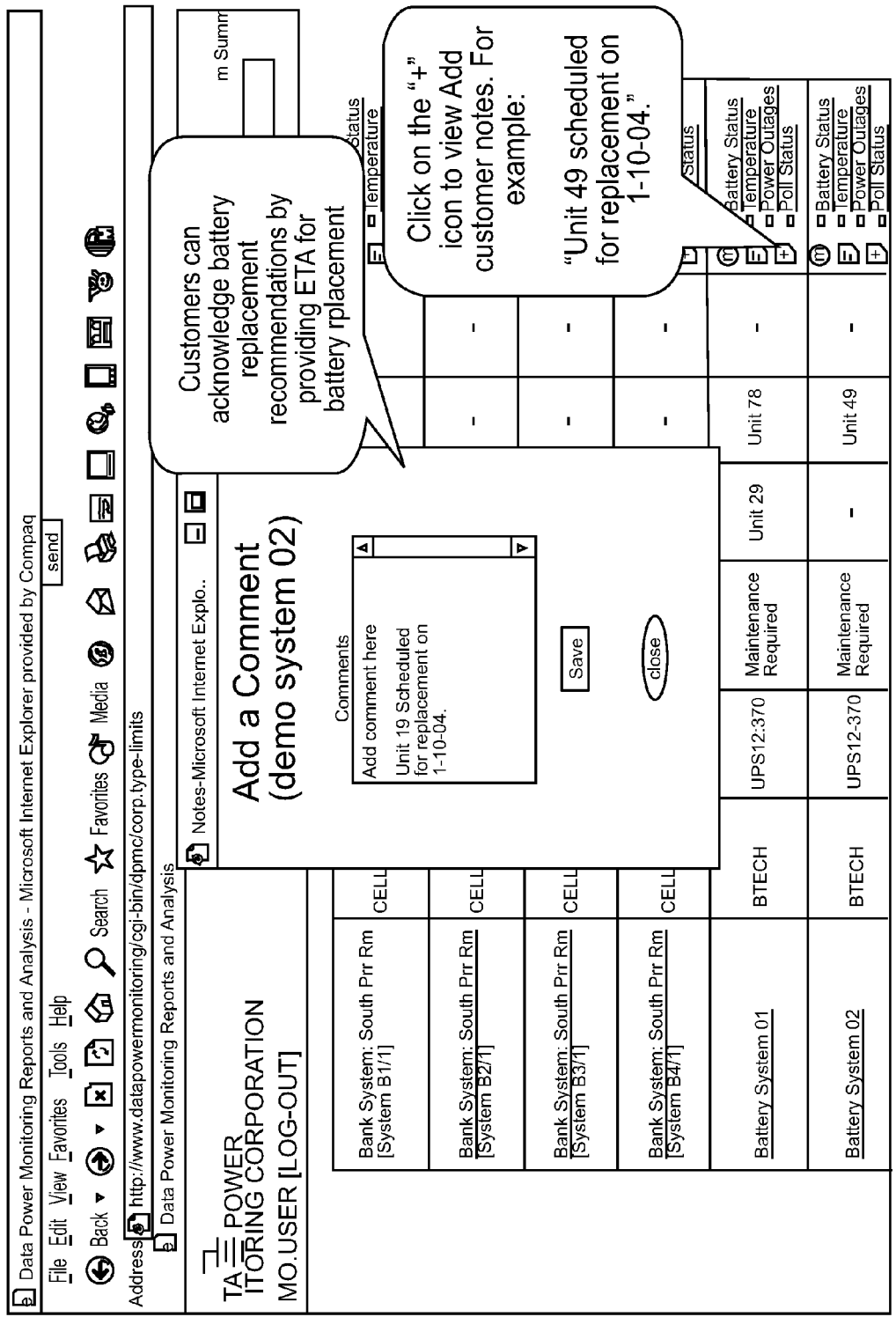
FIG. 13 shows another exemplary GUI according to another exemplary embodiment of the invention.

As shown in FIG. 13, the user may click on another icon that is configured to present the user with a type of an instant messenger or comments-related function that permits the end-user to enter comments into the system that are associated with a particular remote location, battery string, or battery unit. In this way the end-user can collaborate with system administrators to further ensure that the battery-based systems are being properly maintained and to further prevent the end-user from overlooking a particular unit that may be close to failure. In this respect, the system may be collaborative and may permit the end user to have another safety-net in place to prevent a potentially catastrophic failure.

Figure 14:
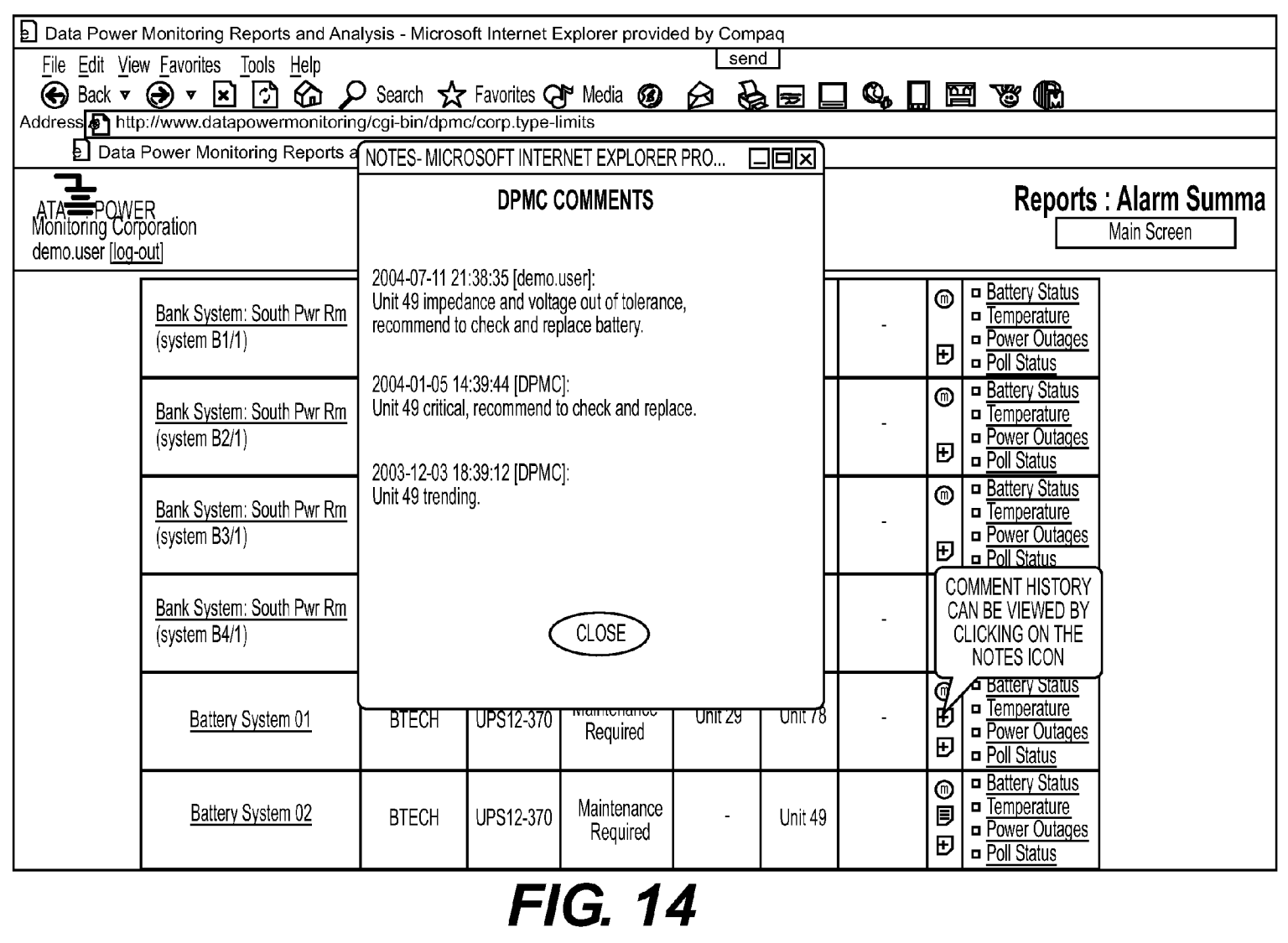
Figure 15:
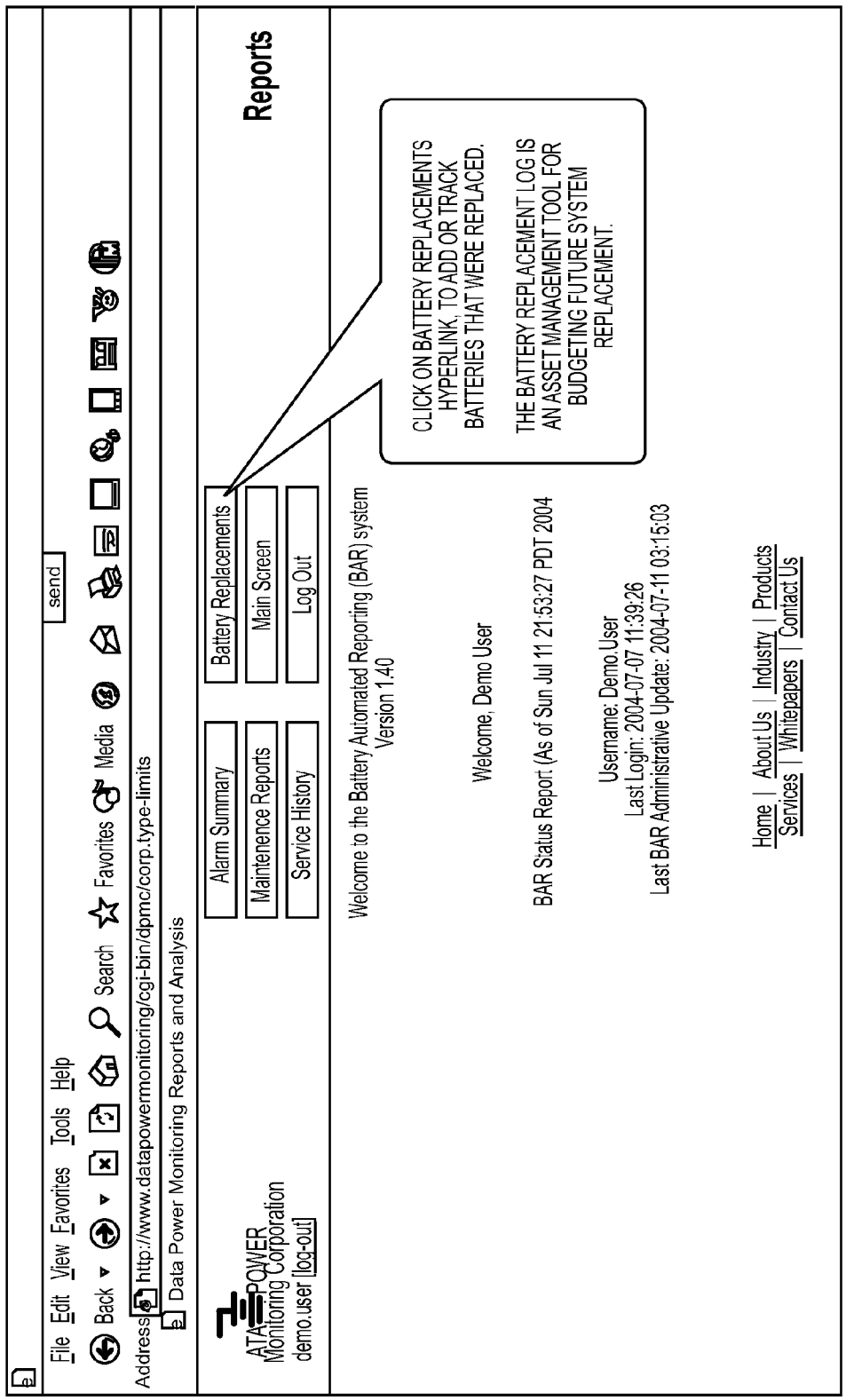
FIG. 15 shows another screen shot of a GUI that may be displayed to an end-user upon logging into an exemplary embodiment of the present invention.
Figure 16:
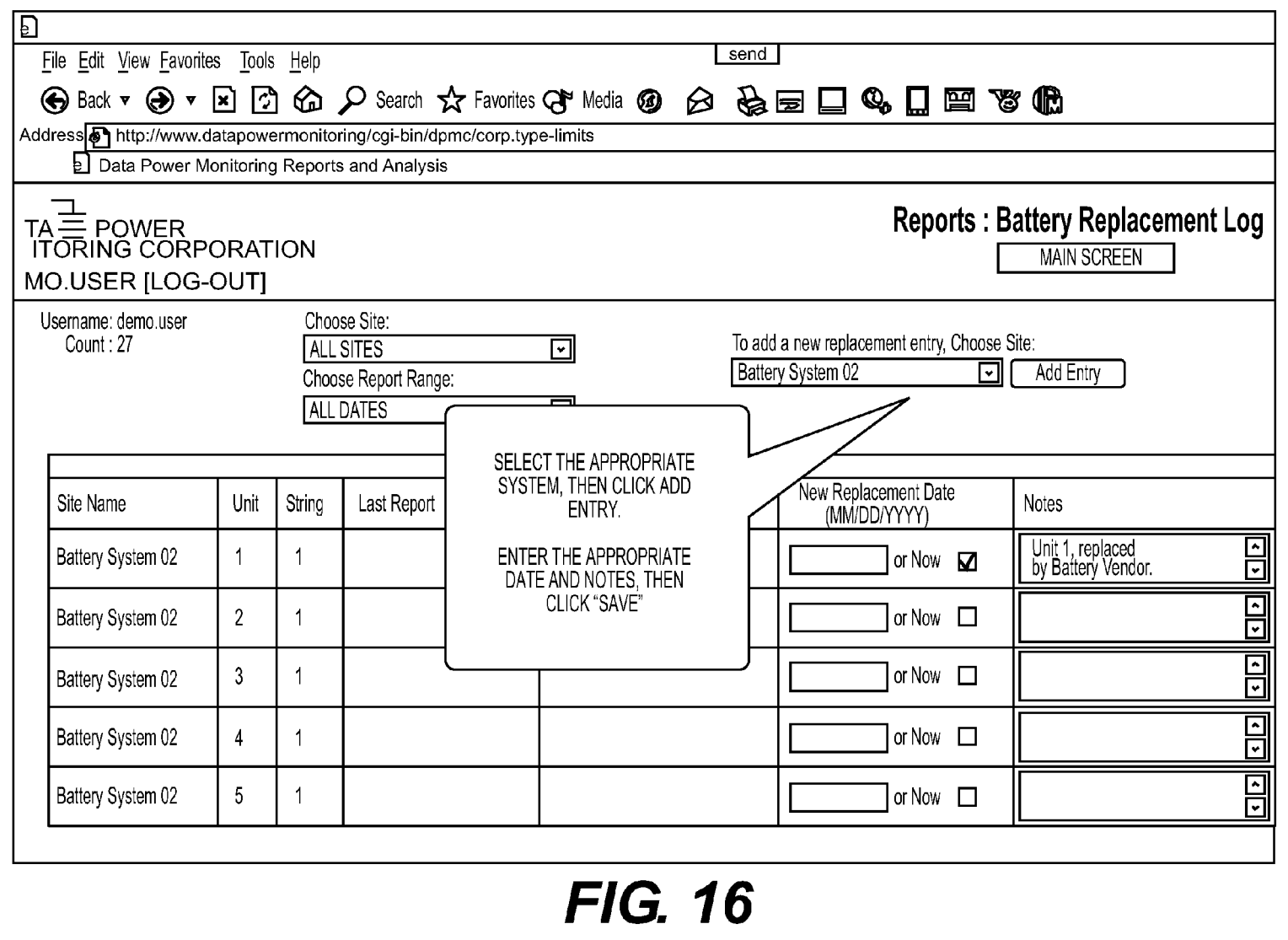

FIG. 14 shows another screen shot of a GUI that an end-user may see upon logging into an exemplary embodiment of the system of the present invention. The end-user may be presented with the option of viewing comments provided by, for example, a system administrator. The system administrator may be employed by the end user to monitor the batteries remotely and to maintain the BAR system. Thus, the system administrator may provide the end-user with useful information, such as abnormalities in the data indicating that a unit or units may be failing, or may alert the end-user to the fact that a power outage has occurred. As shown in FIG. 15, the present invention may also permit the user to archive various aspects regarding the normal on-site maintenance of the batteries. For example, as shown in FIG. 15, the end-user may activate a reference which may present the user with a GUI that will permit, and in some instances guide the user through the steps of updating the battery replacement information. FIG. 16 shows an exemplary screen shot of a website that may be configured to receive data from the end-user and may then transfer the data to the BAR system. The Bar system may then associate the replacement data with other battery-specific data including data associated with various characteristics of the battery, such as, for example, voltage or impedance, the location of the remote site, the battery name, such as "Unit 49" or some other name that may either be predetermined by the system administrator or may be user-defined, for example. As shown in FIG. 16, the end-user may be presented with an interface that includes a number of pull-down type menus that permit the user to make selections regarding, for example, the remote location, the date range for a particular report, and which may be configured to guide the user's input of data associated with, for example, the replacement of the battery. Other maintenance notifications may also be entered by the end-user in a similar manner. This feature may also allow the user to enter a date that is other than the date that the entry was made.

Figure 17:
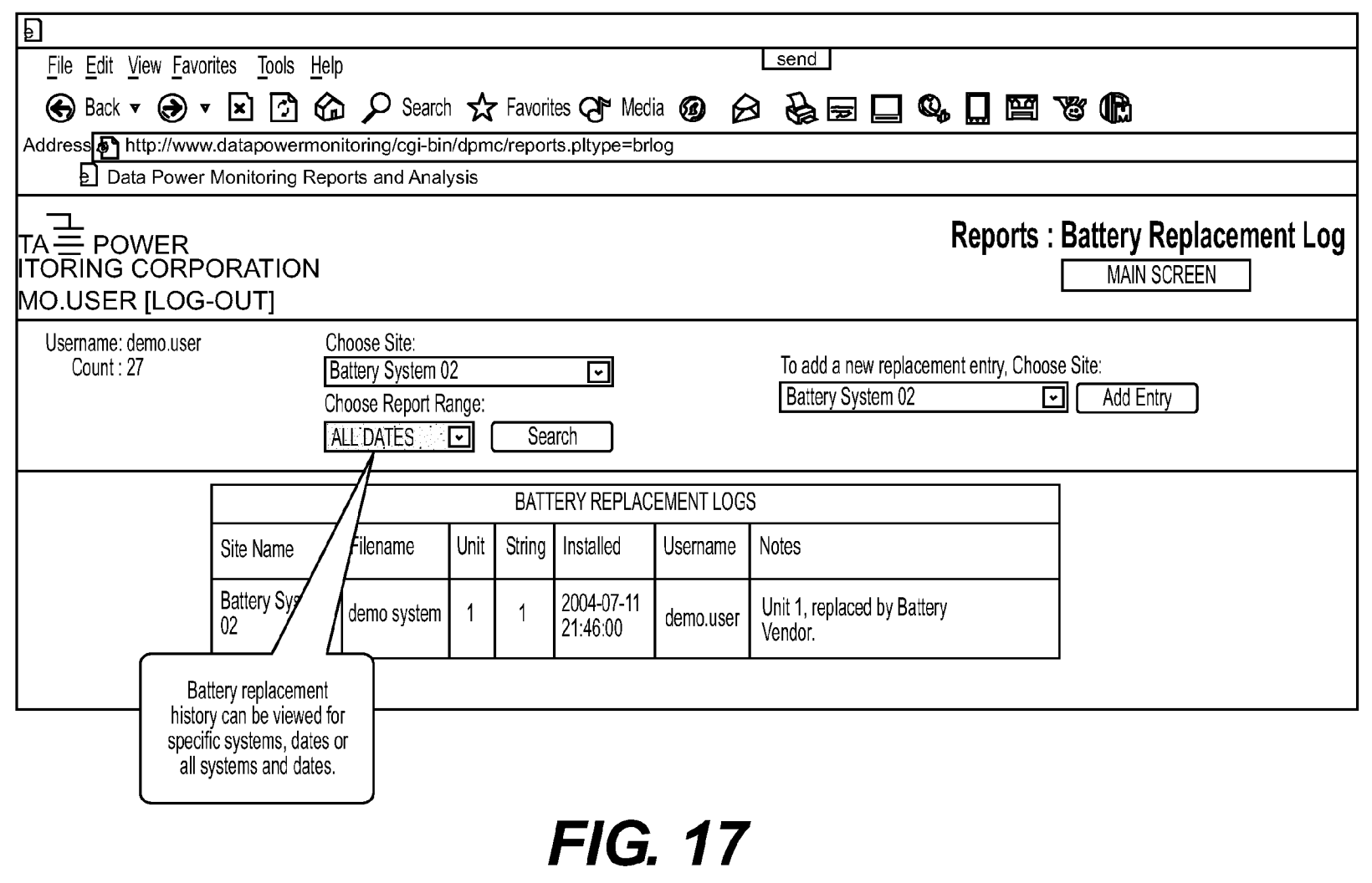

FIG. 17 shows a report that may be generated to provide the end-user with a battery replacement log. The user may determine the date ranges for the historical battery replacement log data. For example, the user may only want to see which batteries have been replaced in, for example, the last year. The report may be generated over any time period that the user may determine.

Figure 18:
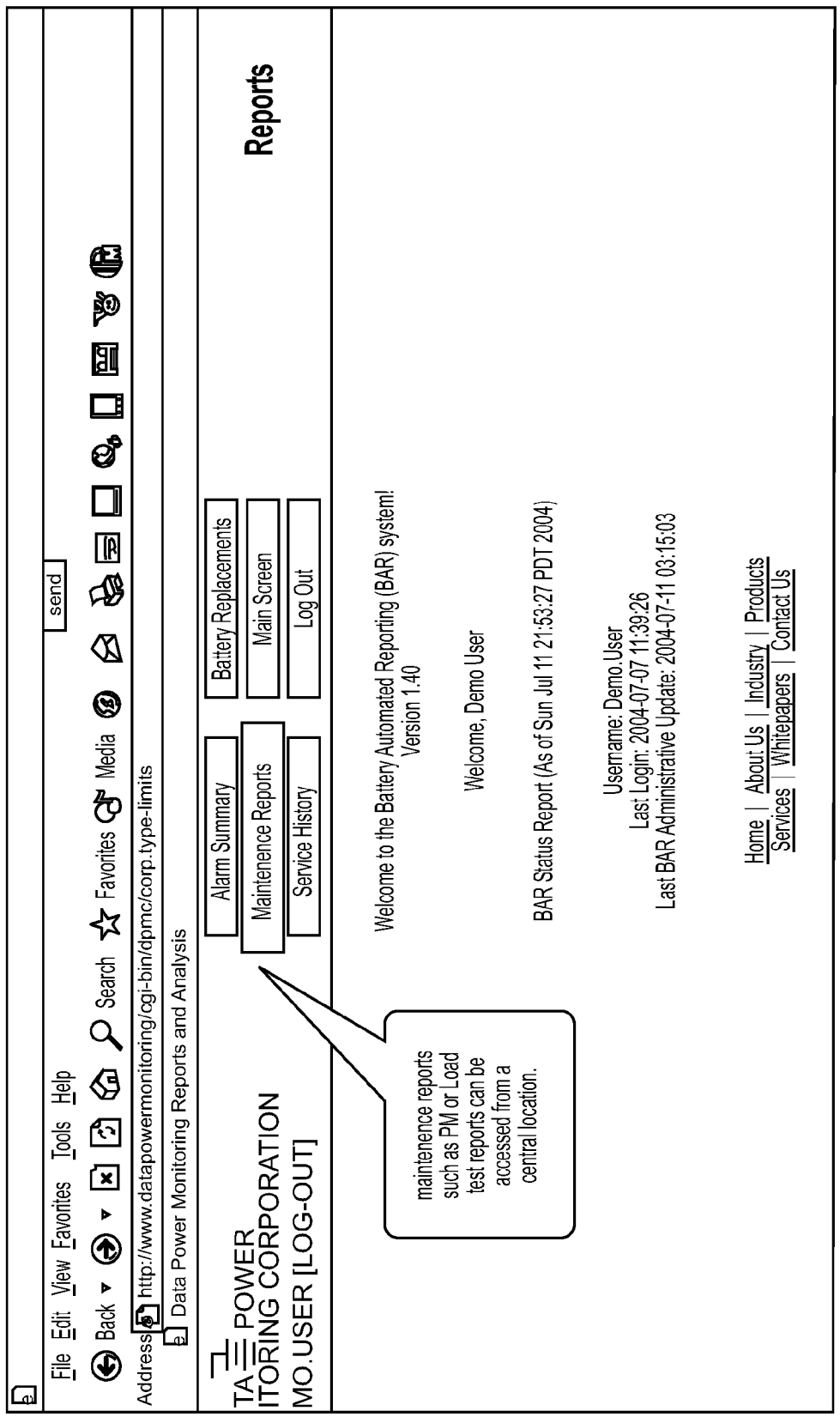
FIG. 18 shows a menu screen that may be displayed to a user, for example, upon the user logging into the system.
Figure 19:
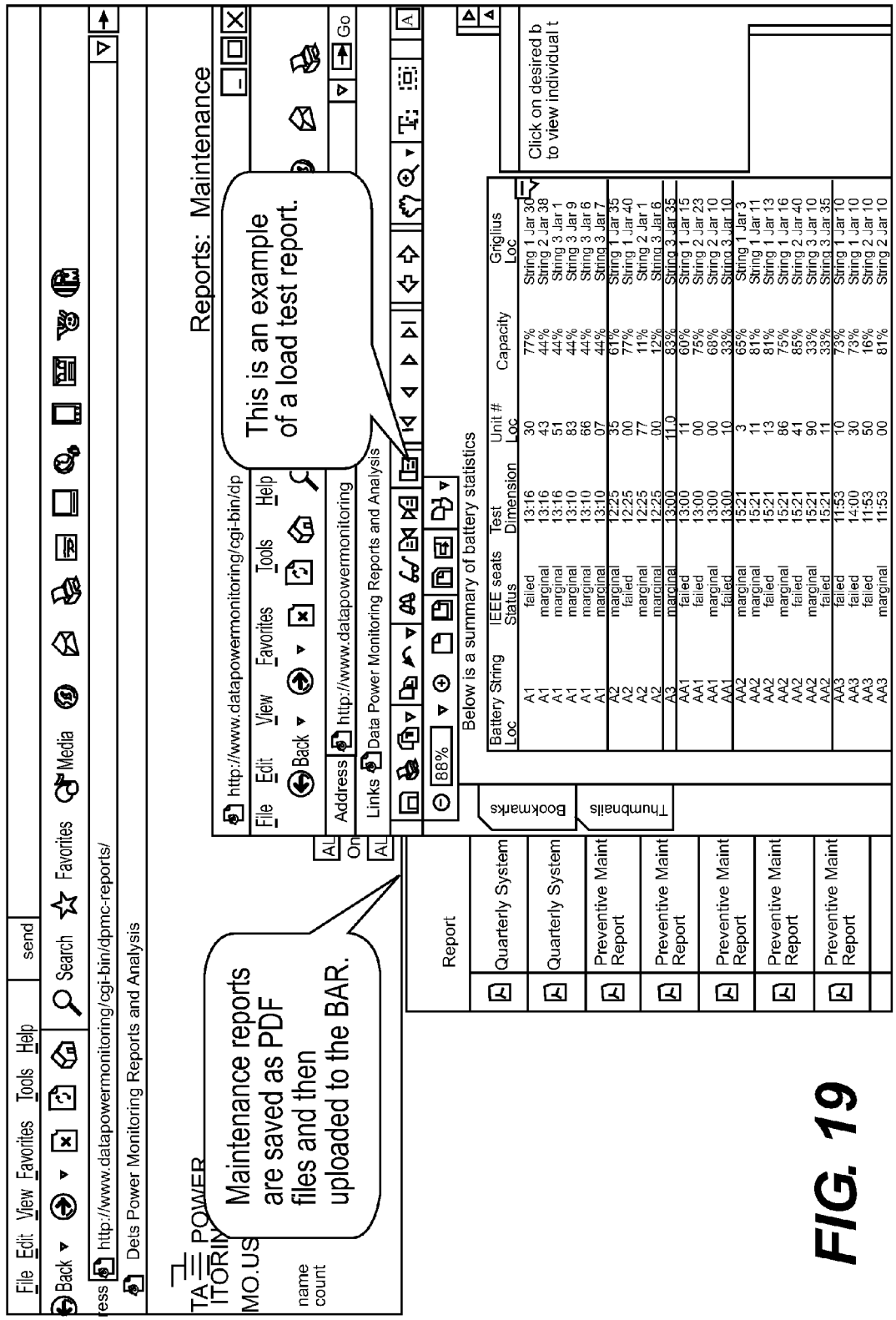
FIG. 19 shows another screen shot of a GUI that may be displayed to an end-user upon logging into an exemplary embodiment of the present invention.

FIG. 18 shows a menu screen that may be displayed to a user, for example, upon the user logging into the system. The menu may include a reference to call up a maintenance report feature that may be included according to one embodiment of the invention. By activating the maintenance report reference shown in FIG. 18, the user may call up a screen that displays a list of maintenance reports, as shown in FIG. 19. This list may include a number of references to documents that may be stored in a memory within the BAR system. The memory may be configured to include a number of files associated with various reports, including periodic reports, such as, for example, quarterly reports or yearly reports of the battery performance and health. As shown in FIG. 19, the files may be saved in the memory associated with the BAR system in .pdf format. Alternatively, these reports may be waved in any user-readable format, including, but not limited to text file format, browser-displayable format (e.g., HTML etc.), MS Word® format, Corel Word Perfect® format, to name a few exemplary formats. These reports may include a report of the status or health of the batteries at various locations. For example, the report may include status designations to call out to the user regarding the status of each battery. For example, some status indicators may include, for example, "Satisfactory", "Marginal" or "Failed". Other indicators or words may be used to convey to the user the status of the batteries. For example, instead of using the aforementioned words, the report may include indicators of green for satisfactory, yellow for marginal, and red for failure. Various other designations of battery status or health are possible and will be readily apparent to those of ordinary skill in the art.

As shown in FIG. 18, the end-user may also be permitted to request a report associated with the service history of the battery units being monitored. When the user requests such a report, the user may be presented with a screen shot such as, for example, the one shown in FIG. 20. As shown in FIG. 20, the end-user may be presented with a number of different options regarding the service history of the various units being monitored by the BAR system. For example, the user may be presented with the name of a particular file that includes the information related to, for example, a particular unit at a remote location. Alternatively, the user may be presented with a file name that reflects the particular remote site being monitored using the BAR system. Additionally, the report may reflect particular comments that may be added by, for example, a system administrator. Alternatively, the BAR system may be configured to automatically display a comment after the occurrence of a predetermined condition. For example, the comment "Unit 30 critical" may be displayed when, for example, the impedance rises above a predetermined amount. Additionally, the system may be configured to revise dates and provide comments and reminders regarding scheduled battery replacements.

The BAR system may include a primary and a secondary BAR system. According to one embodiment of the present invention, the second BAR system may be a redundant BAR system and may be configured to be substantially identical to the first BAR system. The second BAR system may be inline, although it need not be performing any polling or monitoring. The second BAR system may be configured to synchronize it's database with the databases associated with the first or primary BAR system in the event of failure. The first BAR system and the second BAR system may be located at a secure hosting facility. This secure hosting facility may be at any location. The first BAR system (i.e., the primary BAR system) may be located at a first geographic location and the secondary BAR system may be located at a second geographic location. Alternatively, the primary BAR system and the secondary BAR system may be collocated. However, it may be preferable to have the primary and secondary BAR systems in different locations to avoid having both systems subject to an unforeseen incident or natural disaster, for example.

Security. The BAR system may be located behind a protected switch, such as, for example, a layer 3 switch. The layer 3 switch may be configured to provide a first level of network security against unauthorized access over the Internet by preventing, falsification of IP addresses ("IP spoofing") to the local network. In addition to the protected switch, the host and server level, a firewall protection scheme may be implemented. An exemplary embodiment of a protection scheme may be designed to block connections except to specific levels. For example, the service may include the following protection scheme:

| Service | Description |
|---|---|
| HTTP (Web) | Standard Web service |
| HTTPS (SSL Web) | 128 bit Secure Sockets Layer (secure) Web service |

| Service | Description |
| --- | --- |
| FTP | File transfer service for client data upload. For security reasons, FTP user accounts and passwords are kept separate from the system accounts. |

Figure 23:
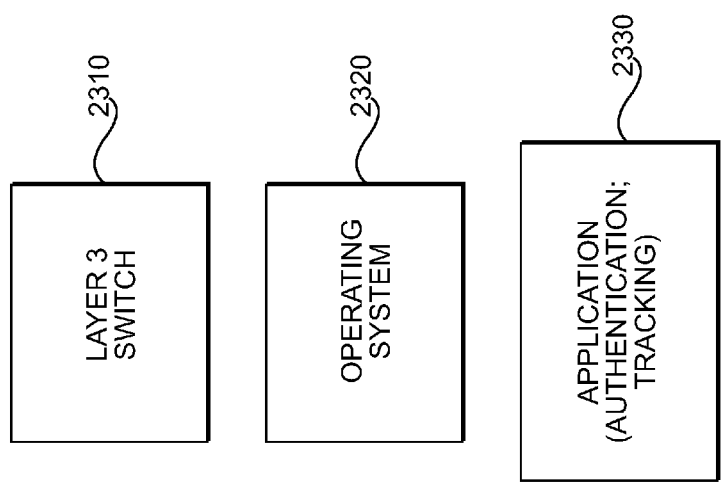
FIG. 23 shows a high-level functional block diagram of a BAR system according to the present invention.

FIG. 23 shows a high-level functional block diagram of a BAR system according to the present invention. The BAR system may include, for example, a layer 32 switch 2310 configured to prevent IP spoofing as described elsewhere in this application. Below the layer 3 switch 2310 the operating system 2320 may be configured to implement the various modules and operations to be performed by the BAR system. Additionally, the operating system 2320 may be configured to block network traffic save from a few ports and may allow access by a specific set of company hosts. Below the operating system 2320 may be an application 2330 that may be configured to authenticates the user logins via the web interface and may be configured to track the user's sessions.

Additionally, according to one embodiment of the invention, remote access to the BAR system may be permitted via a secure shell (SSH), and may only be allowed from a specific set of incoming IP addresses. These IP addresses may be stored in a data structure. The data structure may be any type of a data structure, including, but not limited to a look-up table or a database.

Figure 21:
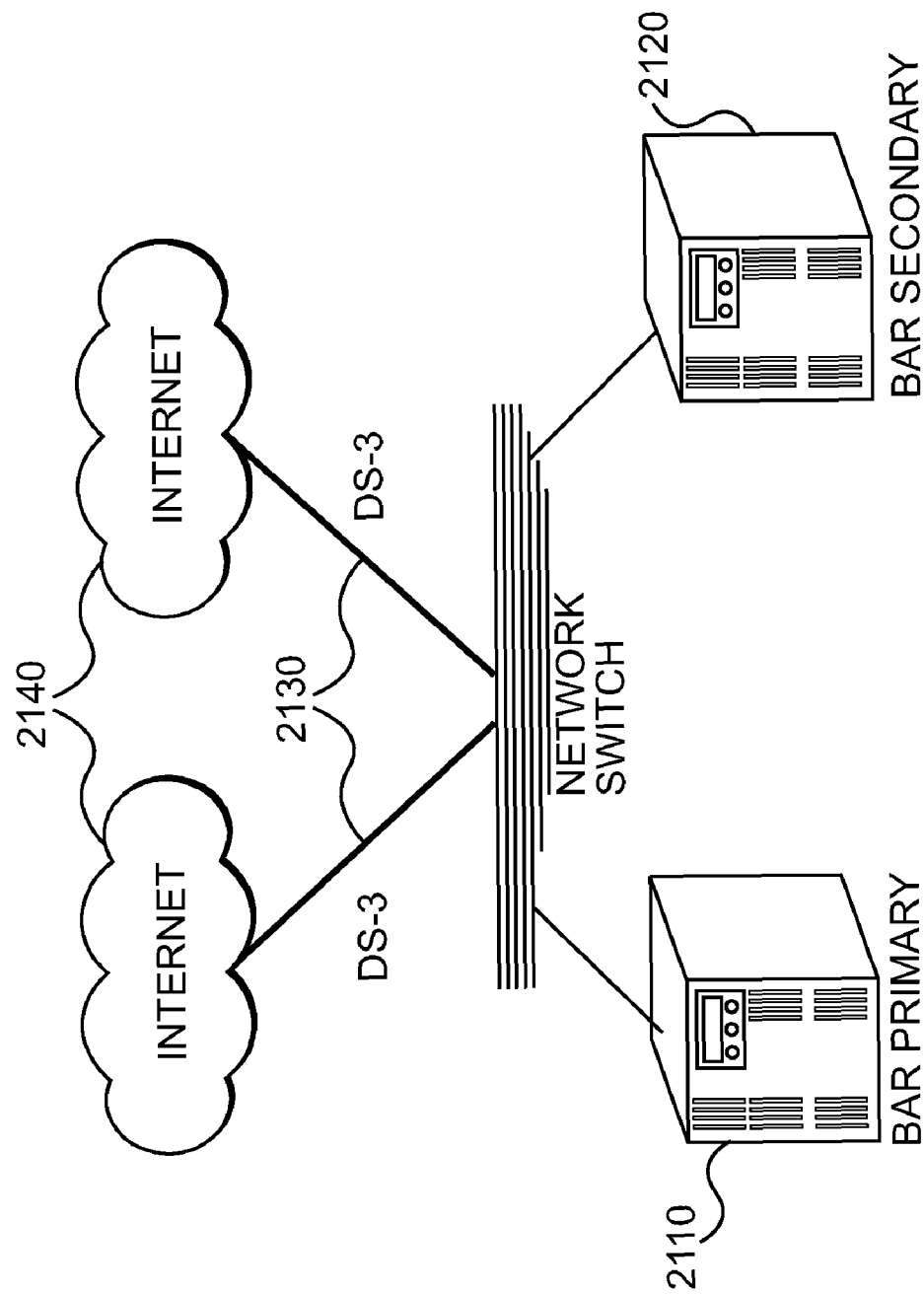
FIG. 21 shows a redundant battery monitoring system according to an exemplary embodiment of the present invention.

As shown in FIG. 21, the BAR system may include a first or primary BAR system 2110 and a secondary BAR system 2120. The primary BAR system 2110 and the secondary BAR system 2120 may be connected to the Internet 2140 via DS-3 connections 2130. As will be appreciated by those skilled in the art, other types of means for connecting to the Internet are well known in the art and may be used in connection with the present invention.

Server Platform Details. The BAR system may be configured to run on a UNIX server or servers, for example. The system may be configured to run on any number of different platforms, such as, for example, a LINUX platform. The BAR system may be designed around any number of other platforms, and therefore, the operating system may be considered to be generic to the present invention. Database programs such as MySQL, may be replaced with any other type of database program including, for example, postgresql. The following exemplary components may be used in connection with an exemplary implementation of the invention on one or more UNIX-based servers.

| Component | Description/Version |
| --- | --- |
| Operating System | Linux; Gentoo distro kernel |
| Web Server | Apache |
| | Mod_ssl |
| Database | MySQL |
| FTP | Pure-ftpd |

Data Integrity Details. Secure storage and access to data associated with each client may be a priority in some systems, particularly in systems where "hacking" into the system is possible. Therefore, access to a particular end-user's files and information may be obtained using a unique user name and password. The BAR system according to an exemplary embodiment of the present invention may be configured to use, for example, a SSL for login and system functions, thereby encrypting the data stream across the Internet. Various other means for encrypting data as it is communicated over the Internet may be used, such encryption may include, for example, the use of a variety of digital signatures, the use of various encryption keys, or the use of a P2P key system.

According to one exemplary implementation of a battery monitoring network according to an aspect of the present invention, each user login may create a unique session cookie for that login session. According to one embodiment of the present invention, the session cookie may be, for example, 20 characters long. Session IDs need not be passed in the URL string or via POST or GET methods. By not passing the session IDs, system integrity may be enhanced. Each authentication may be logged into the database with username, source IP address, and timestamp. These logs may be kept in a manner so that the system administrator can review them if necessary.

According to one exemplary embodiment of the present invention, each individual user may be assigned a specific profile of sites they have permissions to access. These permissions ma be defined in the database associating the IP address with the user name and the password. This permission set may be accessed and checked before any system function, so no user can intentionally or mistakenly access any other client information. The data used by the BAR system may be periodically backed up, as necessary.

Figure 22:
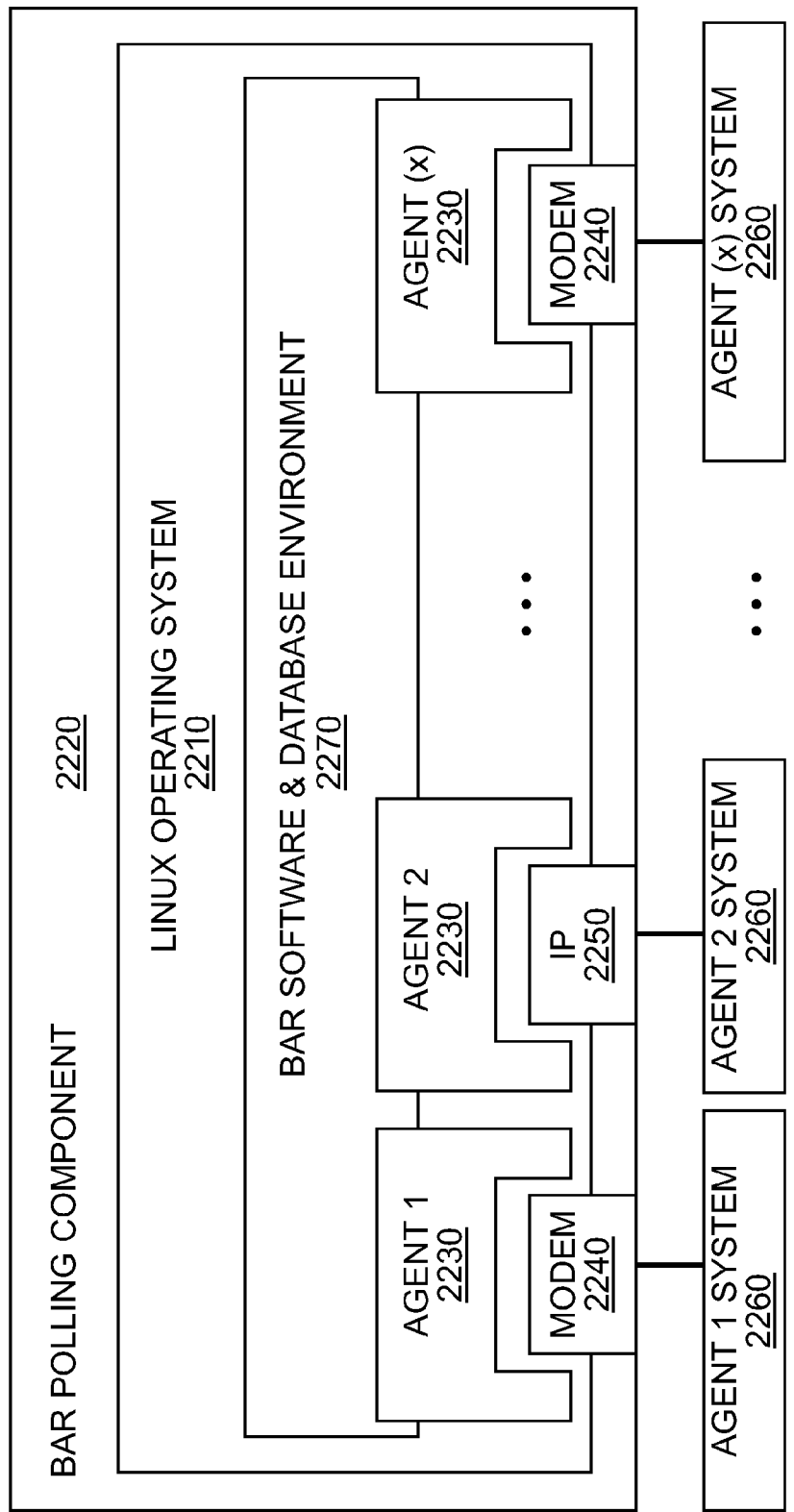
FIG. 22 shows an exemplary implementation of a Battery Automated Reporting ("BAR") system according to one embodiment of the invention.

BAR System Architecture. An exemplary implementation of the BAR system is shown in FIG. 22. A battery monitoring system according to one embodiment of the present invention may include a server component 2210. The server component may include a web-based user interface and may also include applications that allow a user to manage, update, and view reports from a remote location over the Internet or other network. Furthermore, the battery monitoring system according to the present invention may include a polling module 2220. The polling component 2220 may be configured to operate independently and may be configured to gather client data via polling agents 2230. The polling module may be configured to run on its own independent server if desired. Additionally, the polling modules may be configured to run at different times of day, for example. These modules may be configured such that the operation of the other modules does not depend on the other modules being successful. These polling agents may be configured to interact with each individual monitoring system at the remote locations. These polling agents 2230 agents may be configured to poll via a dial-up modem line using modem 2250, or via TCP/IP, using network interface card (NIC) 2260, for example. In some cases, where neither polling method is available, data can be manually uploaded to the BAR system for processing via FTP.

TCP/IP Connectivity. Allowing the BAR system to access battery monitoring units of located within the end-user's systems via TCP/IP may require the BAR systems to reach these systems over the Internet. In some cases, this requires the user to open (or "punch") a hole in a firewall, and may also require the battery monitoring system's IP address to be accessible as a public IP address. Opening a hole in a user's firewall is a serious action, but it doesn't have to be dangerous. As an additional security measure, the BAR system may be designed so that the user only needs to allow a connection from a specific IP address associated with the BAR system, coming into a specific port (for example, those listed in the matrix above) to connect only to the monitoring system's IP address. This is secure because a hacker would need to know what IP address is associated with the user's internal monitoring system, and they would also need to know the address of the BAR system. Even if an outsider did know these items, and attempted a spoof to talk to the device, they would only be able to access that specific port, the monitoring application, and would have no ability to do anything with the system, let alone any other device or host on the user's network.

How the user's IP address is seen as a public IP. As an initial step, the user may determine if their IP address is within a private IP space. If it is in between the following ranges, then it is in a private space:

10.0.0.0-10.255.255.255
172.16.0.0-172.31.255.255
192.168.0-192.168.255.255

Typically, companies may have internal hosts on a private network, and then they may have a firewall around these networks from the Internet. For these hosts to reach the Internet, they need to go through NAT (Network Address Translation), and this is usually performed by the firewall or gateway. So what happens is that if the user's monitoring system is assigned an address of 192.168.1.100 for example, this internal address will be translated to another, public, address before going out on the Internet. The BAR system may be configured to initiate communications with the user's system, and therefore in one embodiment of the invention there may be a mapping from an external address to the user system's internal address. Because the BAR system may have a unique IP address, the user can allow it through a firewall. Furthermore, the BAR system may be configured to include a polling server with a unique IP address.

Figure 24:
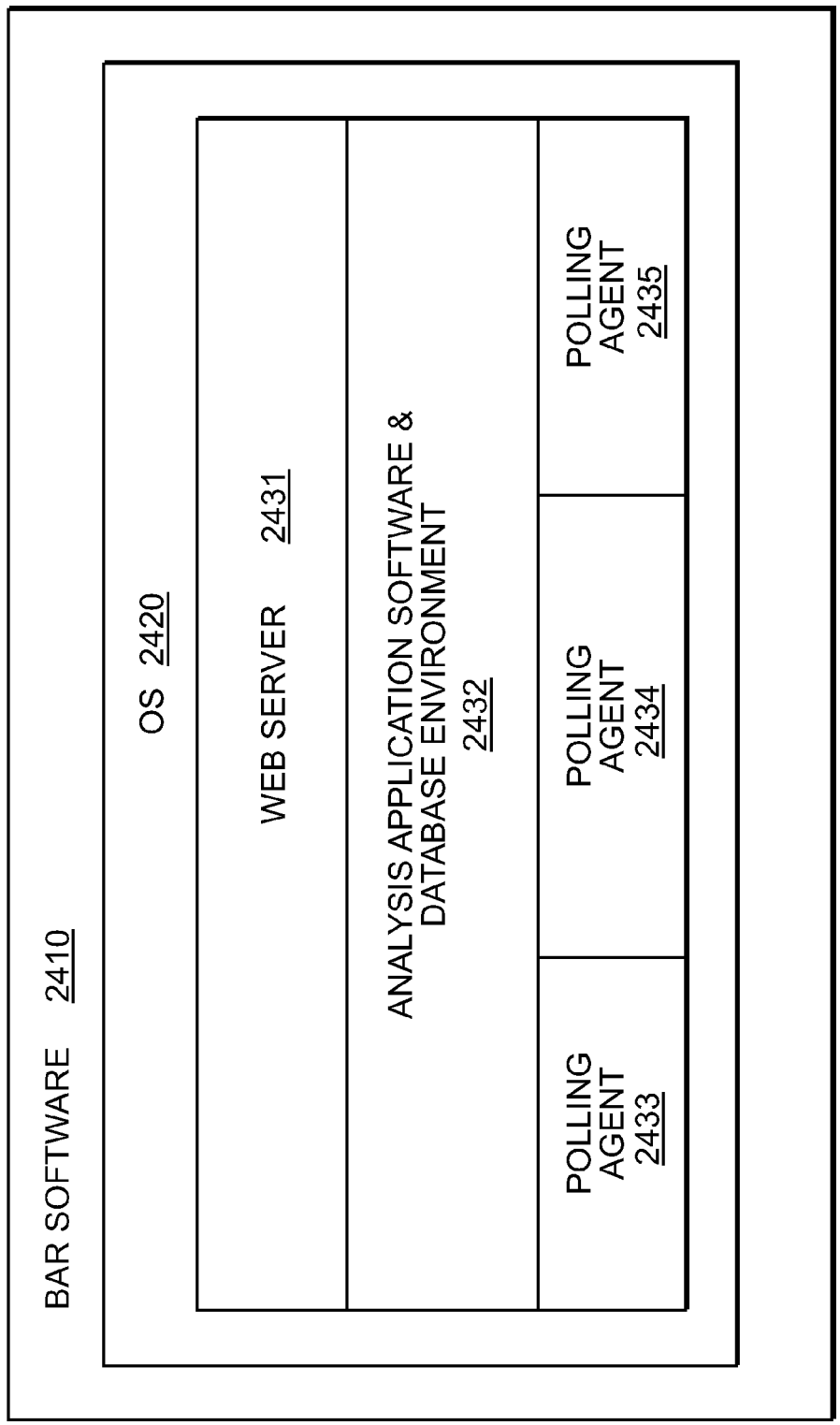
FIG. 24 shows an exemplary implementation the software architecture for a battery monitoring system according to one embodiment of the invention.

The software portion of a battery monitoring system according to an embodiment of the present invention is shown in FIG. 24. The processor-readable software code may include, as discussed above, a BAR software component 2410 that is configured to oversee and coordinate all of the activities of the battery monitoring system according to an embodiment of the invention. The BAR software component 2410 may include, for example, an operating system 2420, such as, for example, a LINUX or a UNIX operating system. Operating system (OS) 2420 may be any type of operating system. The operating system 2420 may be configured to coordinate the activities of the specific processor-readable software modules such as, for example, the web server 2431. The web server 2431 may be configured to receive data from the various databases and may be configured to integrate the data with various graphical display means, such as code for inputting the data from the database or databases into templates for display to the end-user. The web server component 2431 may be configured to format the data from the database into, for example, HTML, Java code, XML or any other acceptable web-readable software code or mark-up language.

Data from more than one type of battery monitoring unit at a remote location, such as those made by different manufacturers may be received by the polling agents, 2433, 2434, and 2435. The polling agents 2433, 2434, and 2435 may be configured to receive data from only one type of battery monitoring unit, such as, for example, battery monitoring units from CELLWATCH, FACTSTAR, or ENERSAFE, to name a few exemplary battery monitoring units. The polling agents 2433, 2434, or 2435 may be configured to receive data from a particular type of battery monitoring unit and may be configured to normalize the data received into a predetermined data format. The data in the predetermined data format may then be stored in one or more databases. The databases may be relational databases. Once the data is stored in the databases, an analysis application 2432 may be configured to analyze the data and may output the data in any of the forms described above to the end-user.

The polling agent 2433, 2434, or 2435 may be configured to interface with the number of various battery monitoring units such as a BTECH system, CELLWATCH battery monitoring units, or FACTSTAR components, among others. These battery monitoring units are merely exemplary and are listed by way of illustration only. The battery monitoring system may be configured to interface with these units via a network card (IP) or via modem. Agents may be associated with each of the battery monitoring units and these agents, also referred to herein as polling modules or mechanisms may be uniquely associated with the particular battery monitoring units that they are configured to monitor. The BAR software 2410 may include software for integrating the data formatted by the polling units to store and further analyze and process the data.

Numerous other configurations of a battery monitoring system may be implemented based on the present disclosure. While the invention has been described with reference to specific preferred embodiments, it is not limited to these embodiments. For example, while specific network architectures have been described, various other architectures are possible, and are believed to be within the scope of the present invention. The invention may be modified or varied in many ways and such modifications and variations as would be obvious to one of skill in the art are within the scope and spirit of the invention and are included within the scope of the following claims.

We claim:

1. Processor-readable software code stored on a processor-readable medium, the code comprising code to:
   receive data in a first format from a first battery monitoring unit;
   receive data in a second format from a second battery monitoring unit;
   normalize the data in the first format and the second format so that the data received in the first format and the second format are in a predetermined format;
   store the normalized data in a database;
   selectively output data associated with an operating condition of a first battery unit associated with the first battery monitoring unit and an operating condition of a second battery unit associated with the second battery monitoring unit.

2. The processor read-able software of claim 1, wherein the code to selectively output data associated with the operating condition of the first battery unit and the second battery unit includes code to selectively output the data in an Internet-accessible format.

3. The processor-readable software code of claim 1, further comprising code to:
   receive at least one of a username and a password and authenticate the at least one of the username and the password.

4. The processor-readable software code of claim 3, wherein the code to selectively output data associated with the operating condition of the first battery unit and the second battery unit includes code to selectively output the data based on the at least one of the username and password.

5. The processor-readable software code of claim 1, further comprising code to:
   generate trend plots associated with a condition of the first battery unit over a period of time.

6. The processor-readable software code of claim 1, further comprising code to:
   transmit a message associated with an alarm condition to a predetermined e-mail address associated with the first battery monitoring unit when the battery unit associated with the first battery monitoring unit is in an alarm condition.

* * * * *